US012720734B2

(12) United States Patent
Yoo et al.

(10) Patent No.: US 12,720,734 B2
(45) Date of Patent: *Aug. 25, 2026

(54) SEMICONDUCTOR MEMORY DEVICE

(71) Applicant: Samsung Electronics Co., Ltd., Suwon-si (KR)

(72) Inventors: Bo Won Yoo, Suwon-si (KR); Seok Han Park, Suwon-si (KR); Ki Seok Lee, Suwon-si (KR); Hyun Geun Choi, Suwon-si (KR); Jin Woo Han, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 448 days.

This patent is subject to a terminal disclaimer.

(21) Appl. No.: 18/522,932

(22) Filed: Nov. 29, 2023

(65) Prior Publication Data

US 2024/0334682 A1 Oct. 3, 2024

(30) Foreign Application Priority Data

Mar. 28, 2023 (KR) ........................ 10-2023-0040511

(51) Int. Cl.
*H10B 12/00* (2023.01)

(52) U.S. Cl.
CPC ........... *H10B 12/482* (2023.02); *H10B 12/09* (2023.02); *H10B 12/33* (2023.02); *H10B 12/50* (2023.02)

(58) Field of Classification Search
CPC ...... H10B 12/482; H10B 12/09; H10B 12/33; H10B 12/50
See application file for complete search history.

(56) References Cited

U.S. PATENT DOCUMENTS

| | | | |
|---|---|---|---|
| 9,024,373 | B2 | 5/2015 | Kim et al. |
| 11,024,600 | B2 | 6/2021 | Liu et al. |

(Continued)

FOREIGN PATENT DOCUMENTS

| | | | |
|---|---|---|---|
| KR | 10-2022-0012120 | A | 2/2022 |
| TW | 202306048 | A | 2/2023 |
| TW | 202309893 | A | 3/2023 |

OTHER PUBLICATIONS

First Office Action dated Nov. 26, 2024 for corresponding application No. TW 113104959.

*Primary Examiner* — Jeff W Natalini
*Assistant Examiner* — Rose Keagy
(74) *Attorney, Agent, or Firm* — Muir Patent Law, PLLC

(57) ABSTRACT

A semiconductor memory device with improved integration and electrical characteristics. The semiconductor memory device includes a peri-gate structure, a first peri-connecting structure on the peri-gate structure, a data storage pattern on the first peri-connecting structure, an active pattern that includes a first surface and a second surface opposite to each other in a first direction, and a first side wall and a second side wall opposite to each other in a second direction, the first surface of the active pattern connected to the data storage pattern and facing a substrate, a bit line on the active pattern, connected to the second surface of the active pattern, and extends in the second direction, a word line on the first side wall of the active pattern and extending in a third direction, a second peri-connecting structure connected to the bit line and a connecting pad connected to the second peri-connecting wiring.

20 Claims, 41 Drawing Sheets

(56) References Cited

U.S. PATENT DOCUMENTS

| | | | | |
|---|---|---|---|---|
| 2008/0225588 | A1 | 9/2008 | Jin et al. | |
| 2022/0102352 | A1* | 3/2022 | Lee | H10B 12/315 |
| 2022/0139927 | A1* | 5/2022 | Chang | H10B 12/315<br>257/296 |
| 2022/0189966 | A1* | 6/2022 | Jang | H10B 12/0335 |
| 2022/0216239 | A1 | 7/2022 | Yoo et al. | |
| 2022/0246180 | A1 | 8/2022 | Lee et al. | |
| 2023/0055147 | A1* | 2/2023 | Lee | H10B 12/05 |

* cited by examiner

SEMICONDUCTOR MEMORY DEVICE

CROSS-REFERENCE TO RELATED APPLICATION

This application claims priority under 35 U.S.C. 119 to Korean Patent Application No. 10-2023-0040511 filed on Mar. 28, 2023, in the Korean Intellectual Property Office, the contents of which in its entirety are herein incorporated by reference.

BACKGROUND

Technical Field

The present disclosure relates to a semiconductor memory device, and more specifically, to a semiconductor memory device including a vertical channel transistor (VCT).

Description of the Related Art

There is a need to increase the degree of integration of a semiconductor memory device to satisfy excellent performance and low price required by consumers. In the case of the semiconductor memory device, because the degree of integration is an important factor in determining the price of a product, an increased degree of integration is particularly required.

In the case of a two-dimensional or planar semiconductor memory device, the degree of integration is mainly determined by an area occupied by unit memory cells, and is therefore greatly affected by the level of fine pattern forming technology. However, since ultra-expensive apparatuses are required to miniaturize the pattern, the degree of integration of the two-dimensional semiconductor memory device is increasing, but is still limited. Accordingly, semiconductor memory devices that include a vertical channel transistor having a channel extending in a vertical direction are being proposed.

SUMMARY

Aspects of the present disclosure provide a semiconductor memory device having improved degree of integration and electrical characteristics.

According to an aspect of the present disclosure, there is provided a semiconductor memory device comprising a peri-gate structure on a substrate, a first peri-connecting structure on the peri-gate structure, a data storage pattern which is disposed on the first peri-connecting structure, an active pattern which is disposed on the substrate, and includes a first surface and a second surface opposite to each other in a first direction, and a first side wall and a second side wall opposite to each other in a second direction, the first surface of the active pattern facing the substrate, a bit line which is disposed on the active pattern, connected to the second surface of the active pattern, and extends in the second direction, a word line which is disposed on the first side wall of the active pattern and extends in a third direction, a second peri-connecting structure which is disposed on the bit line and connected to the bit line and a connecting pad which is disposed on the second peri-connecting structure and connected to the second peri-connecting structure.

According to another aspect of the present disclosure, there is provided a semiconductor memory device comprising a peri-gate structure on a substrate, a first peri-connecting structure on the peri-gate structure, a data storage pattern on the first peri-connecting structure, a first active pattern and a second active pattern which are disposed on the data storage pattern and spaced apart from each other in a first direction, a first word line which is disposed between the first active pattern and the second active pattern on the data storage pattern, and extends in a second direction, a second word line which is disposed between the first active pattern and the second active pattern on the data storage pattern, extends in the second direction, and is spaced apart from the first word line in the first direction, a bit line which is disposed on the first active pattern and the second active pattern and extends in the first direction, a gate isolation pattern which is disposed between the first word line and the second word line, and includes a horizontal part and a protruding part, the protruding part of the gate isolation pattern protruding from the horizontal part of the gate isolation pattern toward the bit line, a width of the horizontal part of the gate isolation pattern being greater than a width of the protruding part of the gate isolation pattern in the first direction, a shielding conductive pattern which is disposed on the bit line and a connecting pad which is disposed on the shielding conductive pattern and connected to the first peri-connecting structure.

According to still another aspect of the present disclosure, there is provided a semiconductor memory device comprising a peri-gate structure on a substrate, a first peri-connecting structure on the peri-gate structure, a data storage pattern on the first peri-connecting structure, first and second active patterns which are disposed on the data storage pattern and disposed alternately along a first direction, back gate electrodes which are disposed on the data storage pattern, and extend in a second direction between the first and second active patterns adjacent to each other, first word lines which are each disposed adjacent to the first active patterns and extend in the second direction, second word lines which are disposed adjacent to the second active patterns and extend in the second direction, a shielding conductive pattern which is disposed on the first active pattern and the second active pattern, and includes a shielding conductive plate and a plurality of shielding conductive protruding parts, the plurality of shielding conductive protruding parts each protruding from the shielding conductive plate toward the data storage pattern and extending in the first direction, bit lines which are disposed between the shielding conductive protruding parts adjacent to each other in the second direction on the first active pattern and the second active pattern, and extend in the first direction, a second peri-connecting structure which includes a second peri-connecting wiring disposed on the shielding conductive pattern, and a second peri-connecting via which connects the second peri-connecting wiring and the first peri-connecting structure and a connecting pad which is disposed on the second peri-connecting wiring and connected to the second peri-connecting wiring.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

DETAILED DESCRIPTION OF THE EMBODIMENTS

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Although ordinal terms such as first and second are used to describe various elements or components in the present specification, these elements or components are not limited by these terms. Unless the context indicates otherwise, these ordinal terms are used only to distinguish an element or component from other elements or components, for example, as a naming convention. Thus, a first element or component referred to in a first section of the specification may be termed a second element or component in a second section of the specification or claims without departing from the technical idea of the present disclosure. In addition, in certain cases, even if a term is not described using “first,” “second,” etc., in the specification, it may still be referred to as “first” or “second” in a claim in order to distinguish different claimed elements from each other. Unless otherwise indicated, ordinal terms such as first, second, and third are used only as a naming convention and do not indicate any particular order of the elements.

It will be understood that when an element is referred to as being “connected” or “coupled” to or “on” another element, it can be directly connected or coupled to or on the other element or intervening elements may be present. In contrast, when an element is referred to as being “directly connected” or “directly coupled” to another element, or as “contacting” or “in contact with” another element (or using any form of the word “contact”), there are no intervening elements present at the point of contact.

Figure 1:
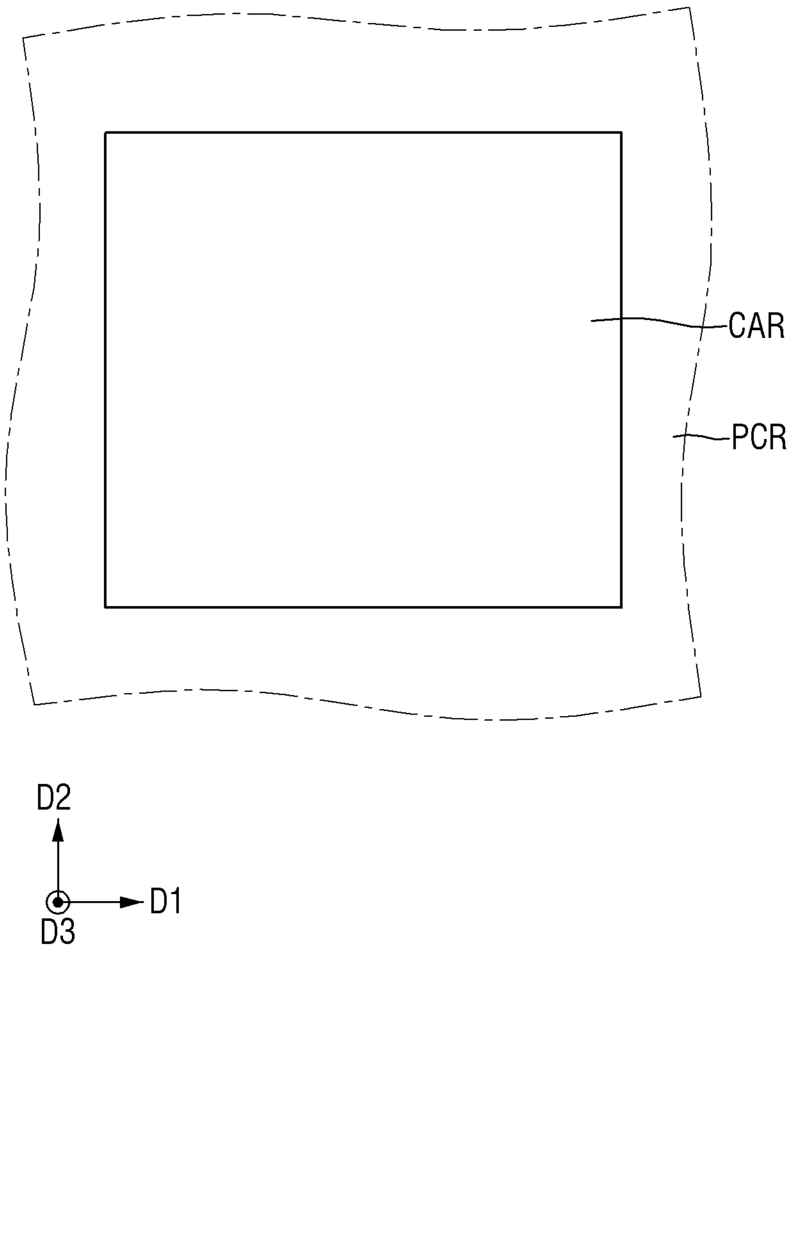
FIG. 1 is a layout diagram of a semiconductor memory device according to some embodiments.
Figure 2:
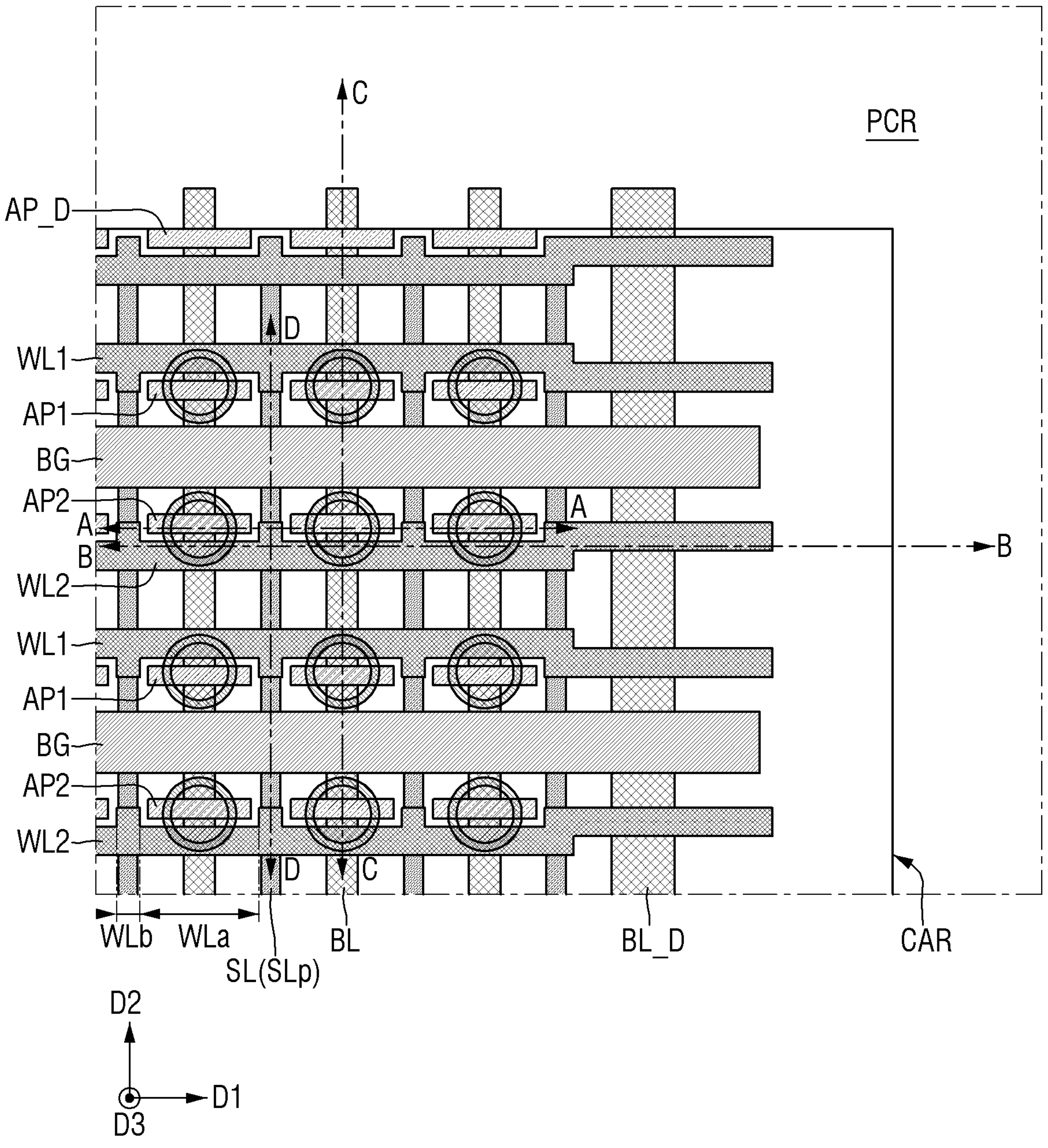
FIG. 2 is a layout diagram of a boundary portion between a cell array region and a peripheral circuit region of FIG. 1.
Figure 3:
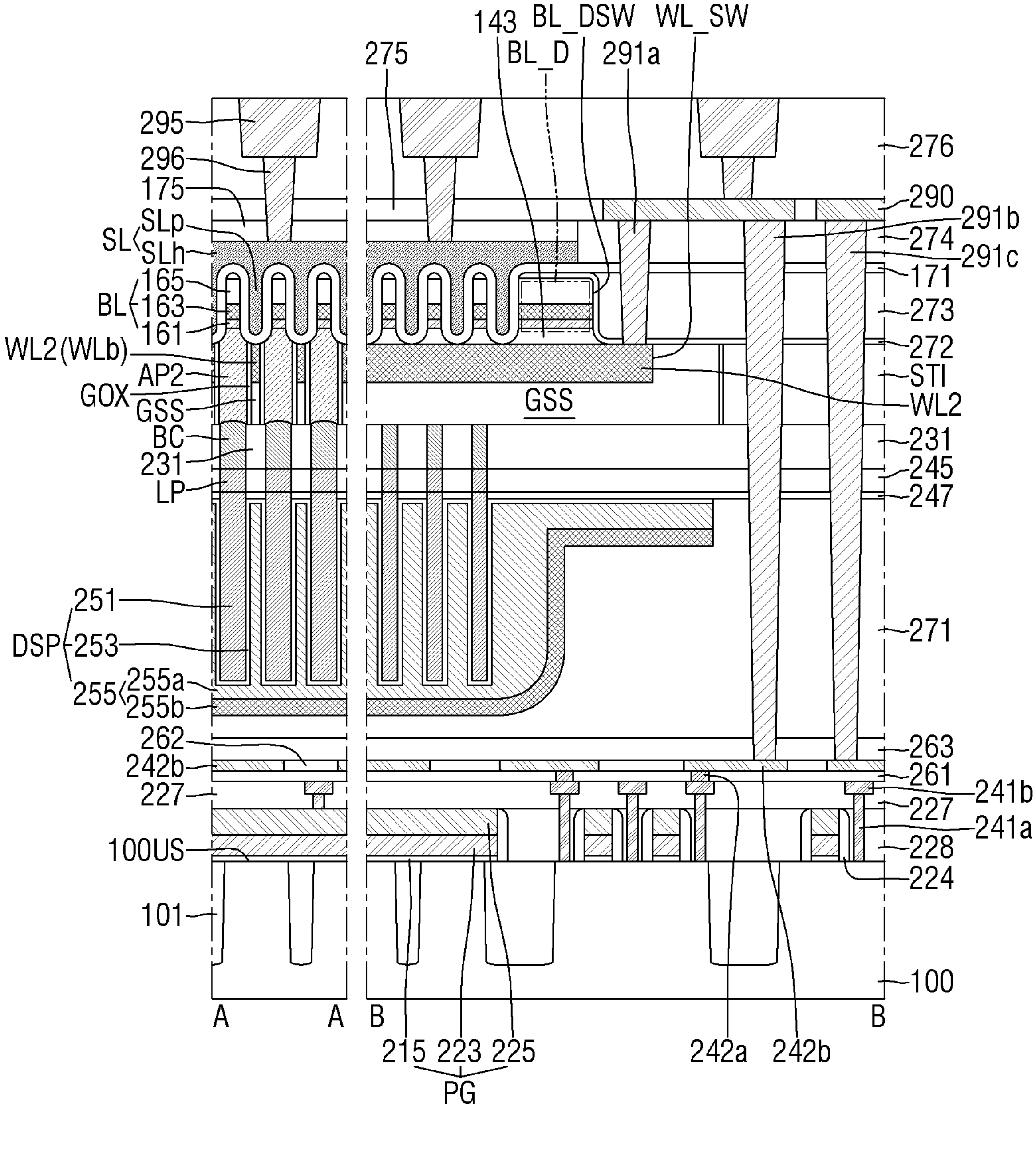
FIG. 3 is a cross-sectional view taken along A-A and B-B of FIG. 2.
Figure 4:
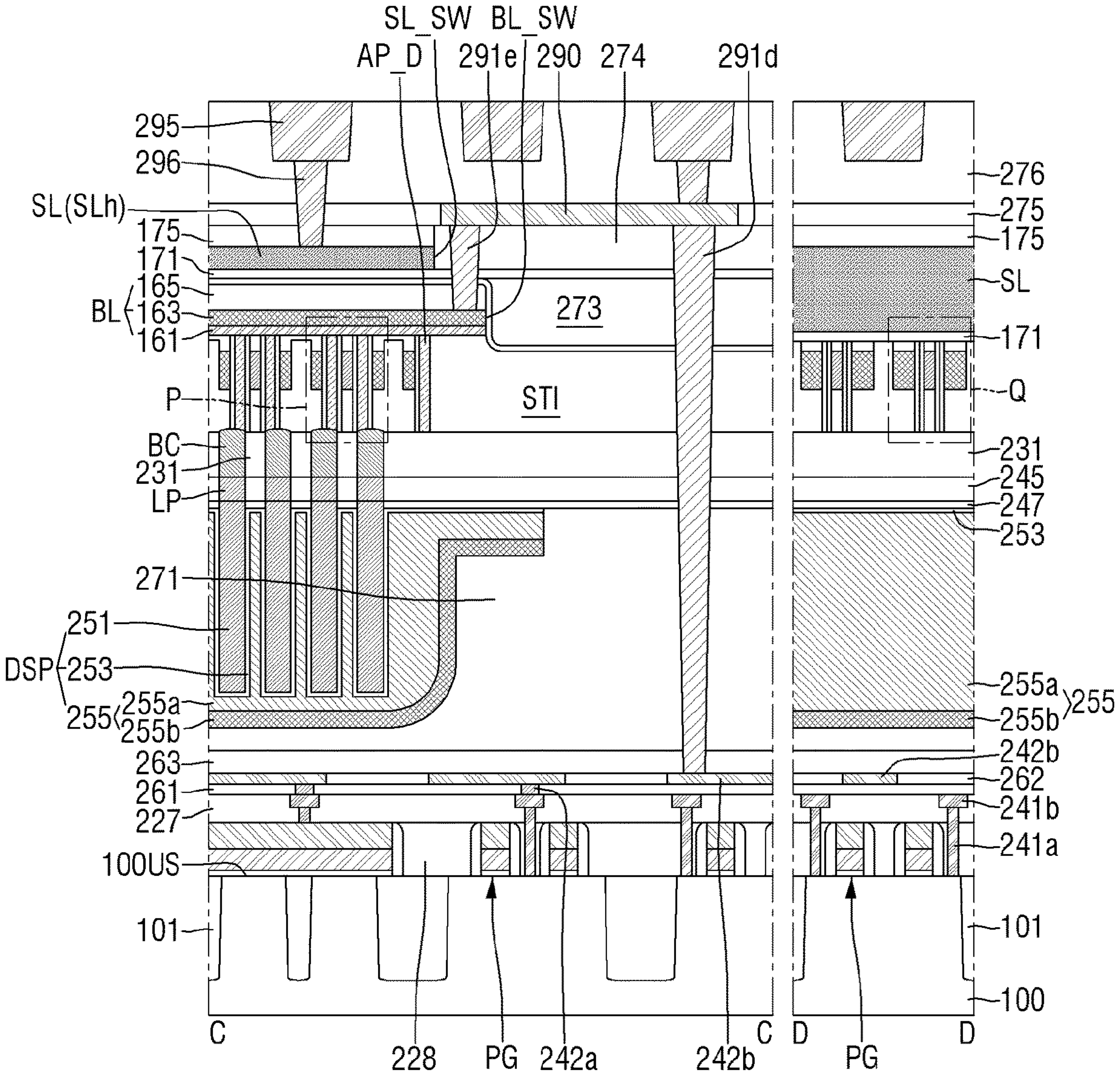
FIG. 4 is a cross-sectional view taken along C-C and D-D of FIG. 2.
Figure 5:
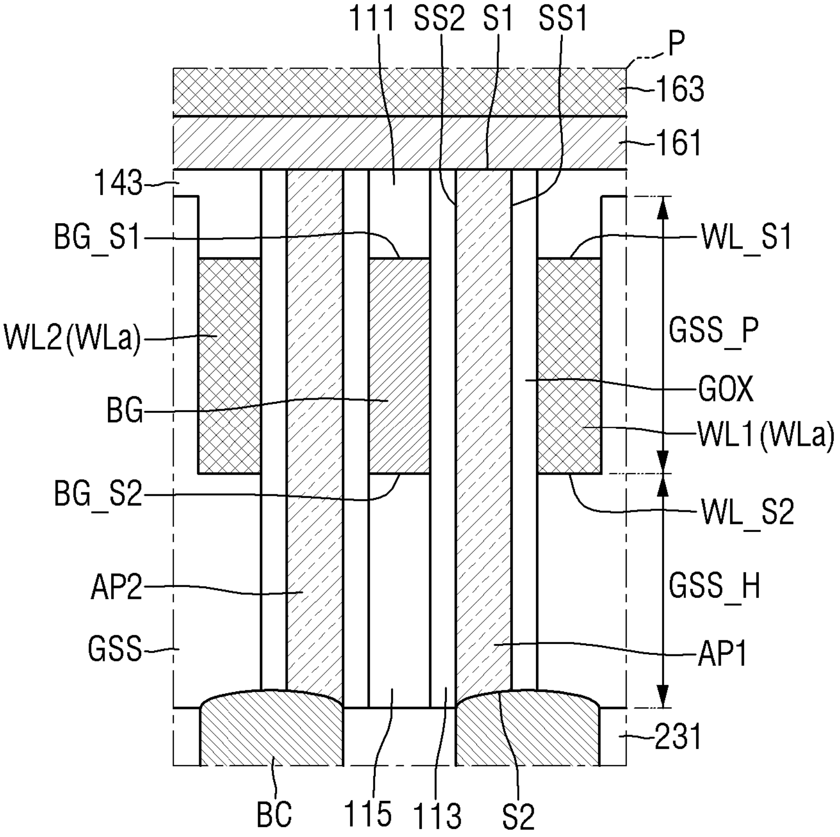
FIG. 5 is an enlarged view of a portion P of FIG. 4.
Figure 6:
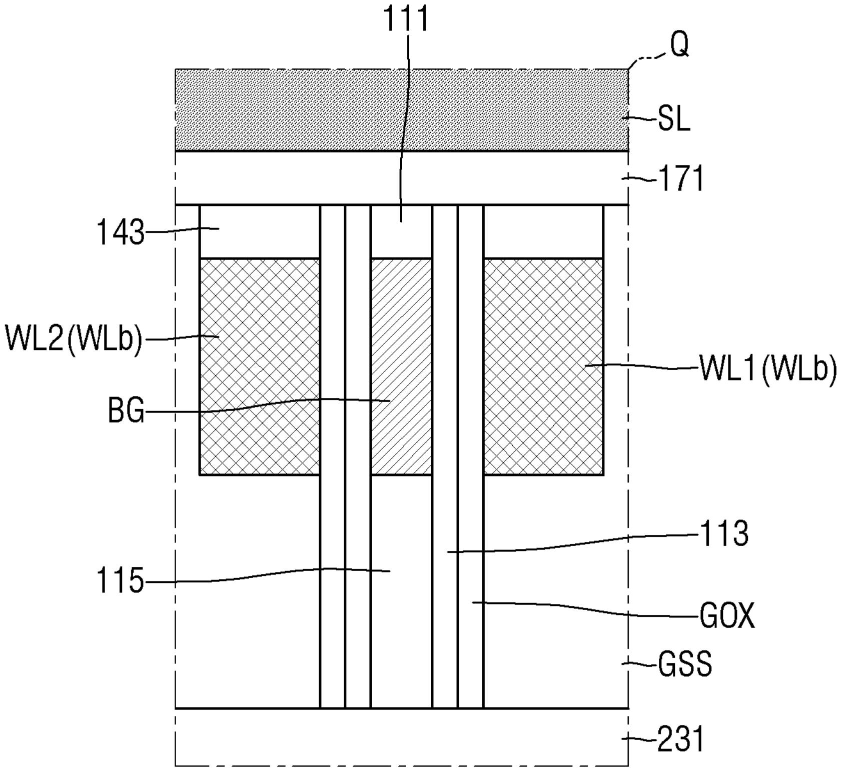
FIG. 6 is an enlarged view of a portion Q of FIG. 4.

FIG. 1 is a layout diagram of a semiconductor memory device according to some embodiments. FIG. 2 is a layout diagram of a boundary portion between a cell array region and a peripheral circuit region of FIG. 1. FIG. 3 is a cross-sectional view taken along A-A and B-B of FIG. 2. FIG. 4 is a cross-sectional view taken along C-C and D-D of FIG. 2. FIG. 5 is an enlarged view of a portion P of FIG. 4. FIG. 6 is an enlarged view of a portion Q of FIG. 4.

The semiconductor memory device according to an embodiment of the present disclosure may include memory cells including a vertical channel transistor (VCT).

Referring to FIGS. 1 to 6, the semiconductor memory device according to some embodiments may include bit lines BL, word lines WL1 and WL2, back gate electrodes BG, a shielding conductive patterns SL, active patterns AP1 and AP2, data storage patterns DSP, first peri-connecting structures which may include first peri-connecting via **242*a* and first peri-connecting wiring 242*b*, second peri-connecting structures which may include second peri-connecting vias 291*a*, 291*b*, 291*c*, 291*d* and 291*e* and a second peri-connecting wiring 290, and upper connecting pads 295**.

In the following description the use of the prefix “peri” denotes that the component is a peripheral component and may be part of a peripheral circuit (e.g., a circuit not in the memory section). As will be described below, a peri-component may be disposed in both a portion of the peripheral circuit region and a portion of the cell array region of the semiconductor memory device.

A substrate 100 may be a silicon substrate, or may be formed of and/or include other materials, such as for example, but are not limited to, silicon germanium, indium antimonide, lead telluride, indium arsenide, indium phosphide, gallium arsenide or gallium antimonide.

The substrate 100 may include an upper side 100US. An element isolation film 101 may be disposed in the substrate 100. The element isolation film 101 may define an active region inside the substrate 100. The element isolation film 101 may be formed of and/or include an insulating material.

The substrate 100 may include a cell array region CAR in which the data storage pattern DSP is disposed, and a peripheral circuit region PCR defined around the cell array region CAR. A cell region element isolation film STI may be disposed on the peripheral circuit region PCR of the substrate 100. From a planar point of view, the cell region element isolation film STI may define the cell array region CAR of the substrate 100.

A peri-gate structure PG may be disposed on the substrate 100. For example, the peri-gate structure PG may be disposed on the upper side 100US of the substrate. The peri-gate structure PG may be disposed over a portion of the cell array region CAR and a portion of the peripheral circuit region PCR. For example, a part of the peri-gate structure PG is disposed in the cell array region CAR of the substrate 100, and the rest of the peri-gate structure PG may be disposed in the peripheral circuit region PCR of the substrate 100.

The peri-gate structure PG may be included in a sensing transistor, a transfer transistor, a driving transistor, and the like. For example, the peri-gate structure PG included in the sensing transistor may be disposed on the substrate 100 of the cell array region CAR, but embodiments are not limited thereto. The types of transistors of the peripheral circuits disposed on the substrate 100 of the cell array region CAR may vary depending on a design placement of the semiconductor memory device.

The peri-gate structure PG may include a peri-gate insulating film 215, a peri-lower conductive pattern 223, and a peri-upper conductive pattern 225. The peri-gate insulating film 215 may include a silicon oxide film, a silicon oxynitride film, a high dielectric constant insulating film having a dielectric constant higher than that of the silicon oxide film or a combination thereof. The high dielectric constant insulating film may include, for example, but is not limited to, at least one of metal oxide, metal oxynitride, metal silicon oxide, and metal silicon oxynitride.

The peri-lower conductive pattern 223 and the peri-upper conductive pattern 225 each may be formed of and/or include a conductive material. For example, the peri-lower conductive pattern 223 and the peri-upper conductive pattern 225 may each be formed of and/or include at least one of a doped semiconductor material, a conductive metal nitride, a conductive metal silicon nitride, a metal carbonitride, a conductive metal silicide, a conductive metal oxide, a two-dimensional material (2D material), and a metal. In the semiconductor device according to some embodiments, the two-dimensional material may be a metallic material and/or a semiconductor material. The 2D material may include a 2D allotrope or a 2D compound, and may include, but is not limited to, at least one of graphene, molybdenum disulfide ($MoS_2$), molybdenum diselenide ($MoSe_2$), tungsten diselenide ($WSe_2$), and tungsten disulfide ($WS_2$). That is, since the above-mentioned 2D materials are only listed as an example, the 2D materials that may be included in the semiconductor memory device of the present disclosure are not limited by the above-mentioned materials. Although the peri-gate structure PG is shown to include the plurality of conductive patterns, embodiments are not limited thereto.

A peri-gate spacer 224 may be disposed on the side wall of the peri-gate structure PG. The peri-gate spacer 224 may be formed of and/or include an insulating material.

A first peri-lower insulating film 227 and a second peri-lower insulating film 228 are disposed on the upper side 100US of the substrate. The first peri-lower insulating film 227 and the second peri-lower insulating film 228 may each be formed of and/or include an insulating material.

A peri-wiring line 241*a* and a peri-contact plug 241*b* may be disposed inside the first peri-lower insulating film 227 and the second peri-lower insulating film 228. The peri-wiring line 241*a* and the peri-contact plug 241*b* may be connected to the conductive patterns including peri-lower conductive pattern 223 and peri-upper conductive pattern 225 of the peri-gate structure PG. Although it is not shown, the peri-wiring line 241*a* and the peri-contact plug 241*b* may be connected to a source/drain region disposed on at least one side of the peri-gate structure PG.

Although the peri-wiring line 241*a* and the peri-contact plug 241*b* are shown to be different films from each other, embodiments are not limited thereto. A boundary between the peri-wiring line 241*a* and the peri-contact plug 241*b* may not be distinguishable in some embodiments. The peri-wiring line 241*a* and the peri-contact plug 241*b* may each be formed of and/or include a conductive material.

A third peri-lower insulating film 261 and a fourth peri-lower insulating film 262 may be disposed on the peri-wiring line 241*a* and the peri-contact plug 241*b*. The third peri-lower insulating film 261 and the fourth peri-lower insulating film 262 may each be formed of and/or include an insulating material. In some embodiments, an insulating film made up of a single film may be disposed on the peri-wiring line 241*a* and the peri-contact plug 241*b*, unlike the shown example.

The first peri-connecting structures, which may include a first peri-connecting via 242*a* and a first peri-connecting wiring 242*b*, may be connected to the peri-wiring line 241*a*. The first peri-connecting via 242*a* and the first peri-connecting wiring 242*b* may each be formed of and/or include a conductive material.

Although the first peri-connecting via 242*a* and the first peri-connecting wiring 242*b* are shown to be different films from each other, embodiments are not limited thereto. Although the first peri-connecting structures are shown as including one first peri-connecting wiring 242*b* disposed on one metal level, this is only for convenience of explanation, and embodiments are not limited thereto. The first peri-connecting structures including first peri-connecting via 242*a* and first peri-connecting wiring 242*b* may include a plurality of first peri-connecting wirings 242*b* disposed at different metal levels from each other.

A fifth peri-lower insulating film 263 may be disposed on the first peri-connecting structures which may include first peri-connecting via 242*a* and first peri-connecting wiring 242*b*. The fifth peri-lower insulating film 263 may be formed of and/or include an insulating material.

Data storage patterns DSP may be disposed on the fifth peri-lower insulating film 263. The fifth peri-lower insulating film 263 may be disposed between the data storage pattern DSP and the first peri-connecting structures which may include first peri-connecting via 242*a* and first peri-connecting wiring 242*b*.

The data storage patterns DSP may be electrically connected to each of the first and second active patterns AP1 and AP2. The data storage patterns DSP may be arranged in the form of a matrix along a first direction D1 and a second direction D2, as shown in FIG. 2.

Here, the first direction D1 and the second direction D2 may be orthogonal to a third direction D3. The first direction D1 may intersect the second direction D2. For example, the third direction D3 may be a thickness direction of the substrate 100. The first direction D1 and the second direction D2 may be parallel to the upper side of the substrate 100.

As an example, the data storage patterns DSP may be capacitors. The data storage patterns DSP may include a capacitor dielectric film 253 interposed between the storage electrodes 251 and the plate electrode 255. From a planar point of view, the storage electrode 251 may have various shapes such a circle, an ellipse, a rectangle, a square, a rhombus, and a hexagon. The storage electrodes 251 may penetrate an upper etching stop film 247. The upper etching stop film 247 may be formed of and/or include an insulating material.

The plate electrode 255 may include a lower plate electrode 255*a* and an upper plate electrode 255*b*. In some embodiments, the plate electrode 255 may be a single film, unlike the shown example. The storage electrode 251 and the plate electrode 255 may each be formed of and/or include, for example, at least one of doped semiconductor material, conductive metal nitride, conductive metal silicon nitride, metal carbonitride, conductive metal silicide, conductive metal oxide and metal. The capacitor dielectric film 253 may be formed of and/or include at least one of a ferroelectric material, an antiferroelectric material, and a paraelectric material. For example, the capacitor dielectric film 253 may be formed of and/or include one of the ferroelectric material, the antiferroelectric material, the paraelectric material, combinations of the ferroelectric and antiferroelectric materials, combinations of the ferroelectric and paraelectric materials, combinations of paraelectric and antiferroelectric materials, and combinations of the ferroelectric material, the antiferroelectric material and the paraelectric material.

In another example, the data storage patterns DSP may be variable resistance patterns that may be switched between two resistance states by electrical pulses applied to the memory element. For example, the data storage patterns DSP may be formed of and/or include a phase-change material, perovskite compounds, transition metal oxide, magnetic materials, ferromagnetic materials, or antiferromagnetic materials.

A first peri-upper insulating film 271 may be disposed on a fifth peri-lower insulating film 263. An upper etching stop film 247 may be disposed on the first peri-upper insulating film 271. The data storage patterns DSP may be disposed in the first peri-upper insulating film 271. The first peri-upper insulating film 271 may cover side walls of the plate electrode 255. The first peri-upper insulating film 271 may be formed of and/or include an insulating material.

Landing pads LP may be disposed on the data storage pattern DSP. The landing pads LP may be disposed on each storage electrode 251. The storage electrode 251 may be in contact with the landing pad LP. From a planar point of view, the landing pads LP may have various shapes such as a circle, an ellipse, a rectangle, a square, a rhombus, and a hexagon.

Pad isolation insulating patterns 245 may be disposed between the landing pads LP. From a planar point of view, the landing pads LP may be arranged in the form of a matrix along the first direction D1 and the second direction D2. The pad isolation insulating patterns 345 may be formed of and/or include an insulating material.

The data storage patterns DSP may completely or partially overlap the landing pads LP in the third direction D3. The data storage patterns DSP may be in contact with all or part of the upper surface of the landing pad LP.

The landing pad LP may be formed of and/or include a conductive material, and may include, for example, at least one of doped polysilicon, conductive metal nitride, conductive metal silicon nitride, metal carbonitride, conductive metal silicide, conductive metal oxide, a two-dimensional (2D) material, and a metal.

Contact patterns BC may be disposed on the landing pad LP. The contact patterns BC may be connected to each of the first active pattern AP1 and the second active pattern AP2. Each contact pattern BC may have various shapes such as a circle, an ellipse, a rectangle, a square, a rhombus, and a hexagon from a planar point of view.

The contact pattern BC may be formed of and/or include a conductive material. The contact pattern BC may be formed of and/or include, for example, at least one of doped polysilicon, conductive metal nitride, conductive metal silicon nitride, metal carbonitride, conductive metal silicide, conductive metal oxide, a two-dimensional material, and a metal.

The contact patterns BC may penetrate a contact interlayer insulating film 231. The contact interlayer insulating film 231 may be disposed on the pad isolation insulating pattern 245. The contact interlayer insulating film 231 may be formed of and/or include an insulating material.

A cell region element isolation film STI may be disposed on the contact interlayer insulating film 231. From the planar point of view, the cell region element isolation film STI may define the cell array region CAR in which word lines WL1 and WL2, back gate electrodes BG, active patterns AP1 and AP2, and the like are disposed. The cell region element isolation film STI may be formed of and/or include an insulating material. Although the cell region element isolation film STI is shown to be a single film, embodiments are not limited to this example of a single film.

The first active patterns AP1 and the second active patterns AP2 are disposed on the substrate 100 and other components may be interposed between the substrate 100 and the first active patterns AP1 and the second active patterns AP2. For example, the first active patterns AP1 and the second active patterns AP2 may be disposed on the data storage pattern DSP. The data storage patterns DSP may be disposed between the first active pattern AP1 and the substrate 100. The data storage patterns DSP may be disposed between the second active pattern AP1 and the substrate 100. The first active patterns AP1 and the second active patterns AP2 may be alternately arranged along the second direction D2 (e.g., may alternate between first active pattern AP1 and a second active pattern).

The first active patterns AP1 may be spaced apart from each other in the first direction D1. The first active patterns AP1 may be spaced apart at regular intervals. The second active patterns AP2 may be spaced apart from each other in the first direction D1. The second active patterns AP2 may be spaced apart at regular intervals. The first active pattern AP1 may be spaced apart from the second active pattern AP2 in the second direction D2. The first and second activation patterns AP1 and AP2 may be arranged two-dimensionally along the first direction D1 and the second direction D2.

For example, the first active pattern AP1 and the second active pattern AP2 may each be made of a single crystal semiconductor material. As an example, the first active pattern AP1 and the second active pattern AP2 may each be made of single crystal silicon.

The first active pattern AP1 and the second active pattern AP2 may each have a length in the first direction D1, a width in the second direction D2, and a height in the third direction D3. Each of the first active pattern AP1 and the second active pattern AP2 may have a substantially uniform width. That is, each of the first active pattern AP1 and the second active pattern AP2 may have substantially the same width on the first and second surfaces S1 and S2. Also, the width of the first active pattern AP1 may be the same as the width of the second active pattern AP2.

The width of the first active pattern AP1 and the width of the second active pattern AP2 may range from several nm to several tens of nm. For example, the width of the first active pattern AP1 and the width of the second active pattern AP2 may be, but are not limited to, 1 nm to 30 nm, more preferably, 1 nm to 10 nm. Lengths of each of the first and second active patterns AP1 and AP2 may be greater than a line width of the bit line BL. That is, lengths of each of the first and second active patterns AP1 and AP2 may be greater than the width of the bit line BL in the first direction D1.

In FIG. 5, each of the first active pattern AP1 and the second active pattern AP2 includes a first surface S1 and a second surface S2 opposite to each other in the third direction D3. For example, the second surfaces S2 of the first and second active patterns AP1 and AP2 face the contact pattern BC. The second surfaces S2 of the first and second active patterns AP1 and AP2 may be connected to the contact patterns BC. The first surfaces S1 of the first and second active patterns AP1 and AP2 face the bit line BL.

Each of the first active pattern AP1 and the second active pattern AP2 may include a first side wall SS1 and a second side wall SS2 that are opposite to each other in the second direction D2. The second side wall SS2 of the first active pattern AP1 may face the first side wall SS1 of the second active pattern AP2.

The first side wall SS1 of the first active pattern AP1 may be adjacent to a first word line WL1. The second side wall SS2 of the second active pattern AP2 may be adjacent to the second word line WL2.

Although not shown, in some embodiments, each of the first active pattern AP1 and the second active pattern AP2 may include a first dopant region adjacent to the bit line BL, and a second dopant region adjacent to the contact pattern BC. Each of the first active pattern AP1 and the second active pattern AP2 may include a channel region between the first dopant region and the second dopant region. The first dopant region and the second dopant region are regions in which dopants are doped in the first active pattern AP1 and the second active pattern AP2. In some embodiments, each of the first active pattern AP1 and the second active pattern AP2 may not include at least one of the first dopant region and the second dopant region.

At the time of operation of the semiconductor memory device, the channel regions of the first and second active patterns AP1 and AP2 may be controlled by the first and second word lines WL1 and WL2 and the back gate electrode BG. Since the first and second active patterns AP1 and AP2 are made up of a single crystal semiconductor material, leakage current characteristics of the semiconductor memory device can be improved.

In the semiconductor memory device according to some embodiments, a dummy active pattern AP_D may be disposed along a boundary of the cell array region CAR. The dummy active pattern AP_D may not be connected to the data storage pattern DSP.

The back gate electrodes BG may be disposed on the data storage pattern DSP. The back gate electrodes BG may be disposed on the contact patterns BC. The data storage patterns DSP may be disposed between the back gate electrode BG and the substrate 100.

The back gate electrodes BG may be spaced apart from each other in the second direction D2. The back gate electrodes BG may be spaced apart at regular intervals.

Each back gate electrode BG may be disposed between a first active pattern AP1 and a second active pattern AP2 which are adjacent to each other in the second direction D2. For example, a first active pattern AP1 may be disposed on one side of each back gate electrode BG, and a second active pattern AP2 may be disposed on the other side of each back gate electrode BG. A height of the back gate electrode BG in the third direction D3 may be smaller than the heights of the first and second active patterns AP1 and AP2 in the third direction.

Each back gate electrode BG may be disposed between a second side wall SS2 of the first active pattern AP1 and a first side wall SS1 of the second active pattern AP2. Each back gate electrode BG may be disposed on the second side wall SS2 of the first active pattern AP1 and the first side wall SS1 of the second active pattern AP2.

The first active pattern AP1 may be disposed between the first word line WL1 and the back gate electrode BG. The second active pattern AP2 may be disposed between the second word line WL2 and the back gate electrode BG. A pair of first word line WL1 and second word line WL2 may be disposed between the back gate electrodes BG adjacent to each other in the second direction D2.

The back gate electrode BG may include a first surface BG_S1 and a second surface BG_S2 that are opposite to each other in the third direction D3. The second surface BG_S2 of the back gate electrode is closer to the data storage pattern DSP than the first surface BG_S1 of the back gate electrode.

The back gate electrode BG may be formed of and/or include a conductive material, and may include, for example, at least one of doped polysilicon, conductive metal nitride, conductive metal silicon nitride, metal carbonitride, conductive metal silicide, conductive metal oxide, a 2D material, and a metal. A voltage is applied to the back gate electrode BG at the time of the operation of the semiconductor memory device, and a threshold voltage of the vertical channel transistor may be adjusted. Since the threshold voltage of the vertical channel transistor is adjusted, deterioration of leakage current characteristics can be prevented.

The back gate isolation pattern 111 may be disposed between the first active pattern AP1 and the second active pattern AP2 adjacent to each other in the second direction D2. The back gate isolation pattern 111 may extend in the first direction D1 along with the back gate electrode BG. The back gate isolation pattern 111 may be disposed on the first surface BG_S1 of the back gate electrode. The back gate isolation pattern 111 may be disposed between the back gate electrode BG and the bit line BL.

The back gate isolation pattern 111 may be made up of an insulating material. The back gate isolation pattern 111 may be formed of and/or include, for example, but is not limited to, a silicon oxide film, a silicon oxynitride film or a silicon nitride film. In some embodiments, the back gate isolation pattern 111 may be formed at the same level as a gate capping pattern 143, which will be described below. Here, the phrase "formed at the same level" means formation by the same fabricating process. For example, a single fill process may form both the gate capping pattern 143 and the back gate isolation pattern 111 as a single layer. The back gate isolation pattern 111 may be formed of the same material as the gate capping pattern 143.

The back gate insulating pattern 113 may be disposed between the back gate electrode BG and the first active pattern AP1, and between the back gate electrode BG and the second active pattern AP2. The back gate insulating pattern 113 may be disposed between the back gate isolation pattern 111 and the first active pattern AP1, and between the back gate isolation pattern 111 and the second active pattern AP2.

The back gate insulating pattern 113 may be formed of and/or made up of an insulating material. The back gate insulating pattern 113 may be formed of and/or include, for example, a silicon oxide film, a silicon oxynitride film, a high dielectric constant insulating film having a dielectric constant higher than that of the silicon oxide film or a combination thereof.

The back gate capping pattern 115 may be disposed on the second surface BG_S2 of the back gate electrode. The back gate capping pattern 115 may be disposed between the contact interlayer insulating film 231 and the back gate electrode BG. The back gate capping pattern 115 may be disposed between the first active pattern AP1 and the second active pattern AP2 adjacent to each other in the second direction D2. The back gate capping pattern 115 may extend in the first direction D1 along with the back gate electrode BG.

The back gate capping pattern 115 may be made up of an insulating material. The back gate capping pattern 115 may be formed of and/or include, for example, at least one of a silicon oxide film, a silicon oxynitride film, and a silicon nitride film.

The first word line WL1 and the second word line WL2 may be disposed on the data storage pattern DSP. The first word line WL1 and the second word line WL2 may be disposed on the contact patterns BC. The data storage patterns DSP may be disposed between the first word line WL1 and the substrate 100. The data storage patterns DSP may be disposed between the second word line WL2 and the substrate 100.

Each of the first word line WL1 and the second word line WL2 may extend in the first direction D1. The first word line WL1 and the second word line WL2 may be alternately arranged in the second direction D2 (e.g., may alternate between the first word line WL1 and the second word line WL2).

The first word line WL1 may be disposed on the first side walls SS1 of the first active patterns AP1. The second word line WL2 may be disposed on the second side walls SS2 of the second active patterns AP2. The first active patterns AP1 and the second active patterns AP2 may be disposed between the first word line WL1 and the second word line WL2 adjacent to each other in the second direction D2.

The first word line WL1 and the second word line WL2 may be spaced apart from the bit line BL and the contact pattern BC in the third direction D3. The first word line WL1 and the second word line WL2 may be positioned between the bit line BL and the contact pattern BC.

Each of the first word line WL1 and the second word line WL2 may have a width in the second direction D2. The width of the first word line WL1 and the width of the second word line WL2 on the bit line BL may differ from the width of the first word line WL1 and the width of the second word line WL2 on the shielding conductive protruding part SLp.

For example, each of the first word line WL1 and the second word line WL2 may include a first portion WLa of the word line, and a second portion WLb of the word line. A width of the first portion WLa of the word line in the second direction D2 may be smaller than a width of the second portion WLb of the word line in the second direction D2.

As an example, the first portion WLa of the word line may overlap the bit line BL in the third direction D3. The first portion WLa of the word line may be a portion disposed on the first side walls SS1 of the first active patterns AP1 and the second side walls SS2 of the second active patterns AP2. The second portion WLb of the word line may overlap the shielding conductive protruding part SLp in the third direction D3. The second portion WLb of the word line may be a portion disposed between the first active patterns AP1 adjacent to each other in the first direction D1, and between the second active patterns AP2 adjacent to each other in the first direction D1.

Each of the first word line WL1 and the second word line WL2 may include the first portion WLa of the word line and the second portion WLb of the word line which are alternately disposed along the first direction D1. On the first word line WL1, each first active pattern AP1 may be disposed between the second portions WLb of the word lines adjacent to each other in the first direction D1. On the second word line WL2, each second active pattern AP2 may be disposed between the second portions WLb of the word lines adjacent to each other in the first direction D1.

The first word line WL1 and the second word line WL2 may include a first surface WL_S1 and a second surface WL_S2 that are opposite to each other in the third direction D3. The first surfaces WL_S1 of the first and second word lines are closer to the bit line BL than the second surfaces WL_S2 of the first and second word lines.

The first word line WL1 will be described as an example. As an example, a height of the first word line WL1 in the third direction D3 may be the same as a height of the back gate electrode BG in the third direction D3. As another example, the height of the first word line WL1 in the third direction D3 may be greater than the height of the back gate electrode BG in the third direction D3. As still another example, the height of the first word line WL1 in the third direction D3 may be smaller than the height of the back gate electrode BG in the third direction D3.

Further, as an example, a height of the first surface WL_S1 of the first word line may be the same as a height of the first surface BG_S1 of the back gate electrode, relative to the contact interlayer insulating film 231. As another example, the first surface WL_S1 of the first word line may be higher than the first surface BG_S1 of the back gate electrode. As yet another example, the first surface WL_S1 of the first word line may be lower than the first surface BG_S1 of the back gate electrode.

In addition, as an example, the height of the second surface WL_S2 of the first word line may be the same as the height of the second surface BG_S2 of the back gate electrode, relative to the contact interlayer insulating film 231. As another example, the second surface WL_S2 of the first word line may be higher than the second surface BG_S2 of the back gate electrode. As yet another example, the second surface WL_S2 of the first word line may be lower than the second surface BG_S2 of the back gate electrode.

The first word line WL1 and the second word line WL2 may be formed of and/or include a conductive material. The first word line WL1 and the second word line WL2 may be formed of and/or include, for example, at least one of doped polysilicon, conductive metal nitride, conductive metal silicon nitride, metal carbonitride, conductive metal silicide, conductive metal oxide, a two-dimensional material, and a metal. Although the first word line WL1 and the second word line WL2 are shown as being a single conductive film, this is only for convenience of explanation, and the embodiment is not limited thereto.

The second surfaces WL_S2 of the first and second word lines WL1 and WL2 may be a plane. Unlike the shown example, as an example, the second surfaces WL_S2 of the first and second word lines WL1 and WL2 may be concavely rounded. As another example, each of the first word line WL1 and the second word line WL2 may have the form of a spacer. For example, the second surfaces WL_S2 of the first and second word lines WL1 and WL2 may be convexly rounded.

The first surfaces WL_S1 of the first and second word lines WL1 and WL2 may be a plane. Unlike the shown example, in some embodiments, the first surfaces WL_S1 of the first and second word lines WL1 and WL2 may have concavely curved surfaces. Although the first surface BG_S1 of the back gate electrode and the second surface BG_S2 of the back gate electrode are shown as being a plane, embodiments are not limited thereto.

Gate insulating patterns GOX may be disposed between the first word line WL1 and the first active pattern AP1, and between the second word line WL2 and the second active pattern AP2. The gate insulating patterns GOX may extend in the first direction D1 along with the first and second word lines WL1 and WL2.

A gate insulating pattern GOX may be formed of and/or include a silicon oxide film, a silicon oxynitride film, a high dielectric constant insulating film having a dielectric constant higher than that of the silicon oxide film or a combination thereof.

The gate insulating pattern GOX may extend along the first side wall SS1 of the first active pattern AP1, and may extend along the second side wall SS2 of the second active pattern AP2. In the semiconductor memory device according to some embodiments, the gate insulating pattern GOX between the first active pattern AP1 and the first word line WL1 may be separated from the gate insulating pattern GOX between the second active pattern AP2 and the second word line WL2, from the viewpoint of the cross-sectional view.

During the fabricating process, the gate insulating pattern GOX may be filled between first active patterns AP1 that are adjacent in the first direction D1, and between second active patterns AP2 that are adjacent in the first direction D1. In such a case, unlike the shown example, the width of the first portion WLa of the word line in the second direction D2 may be substantially the same as the width of the second portion WLb of the word line in the second direction D2.

The gate capping pattern 143 may be disposed between the first word line WL1 and the bit line BL, and between the second word line WL2 and the bit line BL. The gate capping pattern 143 may cover the first surfaces WL_S1 of the first and second word lines WL1 and WL2. The gate capping pattern 143 may be in contact with the bit line BL.

The gate isolation pattern GSS may be disposed on the bit line BL. The gate isolation pattern GSS may be disposed between the bit line BL and the contact pattern BC.

The gate isolation pattern GSS may be disposed between a first word line WL1 and a second word line WL2 that adjacent to one another in the second direction D2. The first word line WL1 and the second word line WL2 may be separated by the gate isolation pattern GSS. The gate isolation pattern GSS may extend in the first direction D1 between the first word line WL1 and the second word line WL2.

The first word line WL1 may be disposed between the gate isolation pattern GSS and the first active pattern AP1. The second word line WL2 may be disposed between the gate isolation pattern GSS and the second active pattern AP2.

The gate isolation pattern GSS may include a horizontal part GSS_H and a protruding part GSS_P. The protruding part GSS_P of the gate isolation pattern may protrude in the third direction D3 from the horizontal part GSS_H of the gate isolation pattern. The protruding part GSS_P of the gate isolation pattern may protrude from the horizontal part GSS_H of the gate isolation pattern toward the bit line BL.

The protruding part GSS_P of the gate isolation pattern may be closer to the bit line BL than the horizontal part GSS_H of the gate isolation pattern. A width of the horizontal part GSS_H of the gate isolation pattern in the second direction D2 is greater than a width of the protruding part GSS_P of the gate isolation pattern in the second direction D2.

The horizontal part GSS_H of the gate isolation pattern may be in contact with the bit line BL. The width of the horizontal part GSS_H of the gate isolation pattern in the second direction D2 is greater than the width of the protruding part GSS_P of the gate isolation pattern in the second direction D2.

The protruding part GSS_P of the gate isolation pattern may be disposed between the side wall of the first word line WL1 and the side wall of the second word line WL2 that face each other. The horizontal part GSS_H of the gate isolation pattern may cover the second surfaces WL_S2 of the first and second word lines WL1 and WL2.

The first word line WL1 and the second word line WL2 may be disposed on the horizontal part GSS_H of the gate isolation pattern. The first word line WL1 and the second word line WL2 may be in the form of getting on the horizontal part GSS_H of the gate isolation pattern. The gate isolation pattern GSS may be formed of and/or include an insulating material. The gate isolation pattern GSS may include a plurality of insulating films, unlike the shown example.

The bit lines BL may be disposed on the first active pattern AP1 and the second active pattern AP2. The bit lines BL may be disposed on the back gate electrode BG, the first word line WL1 and the second word line WL2.

Each bit line BL may extend in the second direction D2 across the back gate electrode BG. Adjacent bit lines BL may be spaced apart in the first direction D1. The bit lines BL include a long side wall extending in second direction D2, and a short side wall extending in first direction D1.

Each bit line BL may extend from the cell array region CAR to the peripheral circuit region PCR. An end portion of each bit line BL may be disposed on the peripheral circuit region PCR. A part of the bit line BL may overlap the cell region element isolation film STI that surrounds the cell array region CAR in the third direction D3.

A dummy bit line BL_D may be disposed on the back gate electrode BG, the first word line WL1 and the second word line WL2. For example, the dummy bit line BL_D may extend in the second direction D2 across the back gate electrode BG and the word lines WL1 and WL2.

The dummy bit line BL_D may be disposed at an outermost part of the cell array region CAR. A width of the dummy bit line BL_D in the first direction D1 may be greater than a width of the bit line BL in the first direction D1.

The bit line BL and the dummy bit line BL_D may include a semiconductor pattern 161, a metal pattern 163, and a bit line mask pattern 165, which are sequentially stacked. Unlike the shown example, the bit line BL may include one of the semiconductor pattern 161 and the metal pattern 163.

The bit line BL and the dummy bit line BL_D may include a conductive bit line. The conductive bit line may be a film including a conductive material among the bit line BL and the dummy bit line BL_D. The conductive bit line may include the semiconductor pattern 161 and the metal pattern 163.

The semiconductor pattern 161 may be formed of and/or include a conductive semiconductor material. The semiconductor pattern 161 may be formed of and/or include at least one of polysilicon, polysilicon germanium, poly germanium, amorphous silicon, amorphous silicon germanium, and amorphous germanium. The metal pattern 163 may be formed of and/or include a conductive material including a metal. The metal pattern 163 may be formed of and/or include, for example, at least one of conductive metal nitride, conductive metal silicon nitride, metal carbonitride, conductive metal silicide, conductive metal oxide, a two-dimensional material, and a metal. The bit line mask pattern 165 may be formed of and/or include an insulating material such as silicon nitride or silicon oxynitride.

In FIG. 3, the bit line BL may include a side wall BL_SW extending in the first direction D1. The dummy bit line BL_D may include long side walls extending in the second direction D2. One of the long side walls of the dummy bit line BL_D may face the bit line BL. The other of the long side walls of dummy bit line BL_D may not face the bit line BL. The side wall BL_DSW of the dummy bit line may be a side wall that does not face the bit line BL, among the long side walls of the dummy bit line BL_D.

The second word line WL2 may include side walls WL_SW extending in the second direction D1. Although it is not shown, the first word line WL1 may also include side walls WL_SW extending in the second direction D1. The following description will be provided using the second word line WL2. The side wall WL_SW of the second word line may be an end of the second word line WL2. A part of the second word line WL2 may protrude in the first direction D1 beyond the side wall BL_DSW of the dummy bit line. The side walls WL_SW of the word line may be located farther from the center of the cell array region CAR than the side wall BL_DSW of the dummy bit line. From a planar point of view, the side wall WL_SW of the word line may be closer to the cell region element isolation film STI than the side wall BL_DSW of the dummy bit line.

A second upper peri-insulating film 273 may be disposed on the cell region element isolation film STI. The second upper peri-insulating film 273 may be disposed around the bit line BL and the dummy bit line BL_D.

Shielding structures may be formed on the first active pattern AP1, the second active pattern AP2, the back gate electrode BG, the first word line WL1, and the second word line WL2. The shielding structures may be disposed on the bit line BL and the dummy bit line BL_D.

The shielding structures may include a shielding conductive pattern SL and shielding insulating films. The shielding insulating films may include a shielding insulating liner 171 and a shielding insulating capping film 175.

The shielding conductive pattern SL may be disposed on the bit line BL and the dummy bit line BL_D. The bit line BL and the dummy bit line BL_D may be disposed between the shielding conductive pattern SL and the first word line WL1. The bit line BL and the dummy bit line BL_D may be disposed between the shielding conductive pattern SL and the second word line WL2.

The shielding conductive pattern SL may include a shielding conductive plate SLh and a plurality of shielding conductive protruding parts SLp. The shielding conductive plate SLh may have a flat plate shape. The shielding conductive plate SLh may be disposed on the cell array region CAR. The shielding conductive plate SLh may be disposed on the bit line BL and the dummy bit line BL_D.

The plurality of shielding conductive protruding parts SLp may protrude from the shielding conductive plate SLh in the third direction D3. Each shielding conductive protruding part SLp may protrude toward the word lines WL1 and WL2. Each shielding conductive protruding part SLp may protrude toward the substrate 100. Each shielding conductive protruding part SLp may extend in the second direction D2. Each shielding conductive protruding part SLp may be adjacent in the first direction D1.

The bit line BL may be disposed between the shielding conductive protruding parts SLp adjacent in the first direction D1. In FIG. 3, the shielding conductive protruding part SLp may be disposed on one side of the dummy bit line BL_D. However, the shielding conductive protruding part SLp may not be disposed on the other side of the dummy bit line BL_D.

The shielding insulating liner 171 may be disposed on the bit line BL and the dummy bit line BL_D. The shielding insulating liner 171 may be disposed between the bit line BL and the shielding conductive pattern SL, and between the dummy bit line BL_D and the shielding conductive pattern SL.

The shielding insulating liner 171 may extend along the profile of the bit line BL, the upper surface of the dummy bit line BL_D, and the upper surface of the second upper peri-insulating film 273. The shielding insulating liner 171 may extend along the profiles of the shielding conductive plate SLh and the shielding conductive protruding part SLp.

The shielding insulating capping film 175 may be disposed on the shielding conductive pattern SL. The shielding conductive pattern SL may be disposed between the shielding insulating liner 171, which may be a shielding insulating film, and the shielding insulating capping film 175.

A third upper peri-insulating film 274 may be disposed on the second upper peri-insulating film 273. The third upper peri-insulating film 274 may cover side walls of the shielding insulating capping film 175 and side walls SL_SW of the shielding conductive pattern. The shielding conductive plate SLh includes side walls SL_SW of the shielding conductive pattern.

The shielding conductive pattern SL may be formed of and/or include a conductive material. The shielding conductive pattern SL may include, for example, at least one of conductive metal nitride, conductive metal silicon nitride, metal carbonitride, conductive metal silicide, conductive metal oxide, a two-dimensional material, and a metal. The shielding insulating liner 171, the shielding insulating capping film 175, and the third upper peri-insulating film 274 may each be formed of and/or include an insulating material.

In FIG. 4, the bit line BL may include side walls BL_SW extending in the first direction D1. The side wall BL_SW of the bit line may be an end of the bit line BL. The shielding conductive pattern SL may include side walls SL_SW of the shielding conductive pattern extending in the first direction D1. A part of the bit line BL may protrude in the second direction D2 beyond the side wall SL_SW of the shielding conductive pattern. The side wall BL_SW of the bit line may be located farther from the center of the cell array region CAR than the side wall SL_SW of the shielding conductive pattern.

A bit line etching stop film 272 may be disposed between the shielding structures, which may include 171, SL, and 175, and the dummy bit line BL_D. The bit line etching stop film 272 may be disposed between the shielding structures, which may include 171, SL and 175, and the bit line BL. The bit line etching stop film 272 may extend along the side walls BL_SW of the bit line and the side walls BL_DSW of the dummy bit line. The bit line etching stop film 272 may be disposed between the second upper peri-insulating film 273 and the cell region element isolation film STI. The bit line etching stop film 272 may be formed of and/or include an insulating material.

The second peri-connecting structures including second peri-connecting vias 291*a*, 291*b*, 291*c*, 291*d* and 291*e*, and a second peri-connecting wiring 290 may be disposed on the first peri-connecting structures which may include first peri-connecting via 242*a* and first peri-connecting wiring 242*b*. The second peri-connecting structures including second peri-connecting vias 291*a*, 291*b*, 291*c*, 291*d* and 291*e*, and a second peri-connecting wiring 290 may be connected to the first peri-connecting structures including first peri-connecting via 242*a* and first peri-connecting wiring 242*b*. For example, the first peri-connecting structures may be lower peri-connecting structures, and the second peri-connecting structures may be upper peri-connecting structures.

The second peri-connecting structures may include second peri-connecting vias 291*a*, 291*b*, 291*c*, 291*d* and 291*e*, and a second peri-connecting wiring 290. The second peri-connecting vias 291*a*, 291*b*, 291*c*, 291*d* and 291*e* are connected to the second peri-connecting wiring 290.

The second peri-connecting wiring 290 may be disposed on the bit line BL and the shielding conductive pattern SL. The second peri-connecting wiring 290 may be disposed in the fourth upper peri-insulating film 275. The fourth upper peri-insulating film 275 may be disposed on the third upper peri-insulating film 274 and the shielding structures, which may include 171, SL and 175. The fourth upper peri-insulating film 275 may be formed of and/or include an insulating material.

The second peri-connecting vias 291*a*, 291*b*, 291*c*, 291*d* and 291*e* may penetrate at least one of the first to third upper peri-insulating films 271, 273 and 274.

The second peri-connecting vias 291*a*, 291*b*, 291*c*, 291*d* and 291*e* may connect the first peri-connecting structures including first peri-connecting via 242*a* and first peri-connecting wiring 242*b* and the second peri-connecting wiring 290. The second peri-connecting wiring 290 may be connected to the bit line BL, the first word line WL1, the second word line WL2, the back gate electrode BG, the date storage pattern DSP, and the like through at least a part of the second peri-connecting vias 291*a*, 291*b*, 291*c*, 291*d* and 291*e*.

Although the second peri-connecting wiring 290 is shown as not being connected to the shielding conductive pattern SL, embodiments are not limited thereto. Unlike the shown example, in some embodiments, the second peri-connecting wiring 290 may be connected to the shielding conductive pattern SL.

The second peri-connecting vias 291*a*, 291*b*, 291*c*, 291*d* and 291*e* and the second peri-connecting wiring 290 may each be formed of and/or include a conductive material. Although the second peri-connecting structures are shown as including one second peri-connecting wiring 290 disposed on one metal level, this is only for convenience of explanation, and embodiments are not limited thereto. The second peri-connecting structures may include a plurality of second peri-connecting wirings 290 disposed on different metal levels from each other.

An upper connecting pad 295 and an upper connecting plug 296 may be disposed on the second peri-connecting structures. The upper connecting pad 295 and the upper connecting plug 296 may be disposed in the fifth upper peri-insulating film 276.

The upper connecting pad 295 and the upper connecting plug 296 may be connected to the second peri-connecting wiring 290. The upper connecting pads 295 may be connected to the first peri-connecting structures through the second peri-connecting structures.

The upper connecting pad 295 and the upper connecting plug 296 may be connected to the shielding conductive pattern SL. The upper connecting pad 295 and the upper connecting plug 296 each may be formed of and/or include a conductive material. The fifth upper peri-insulating film 276 may be formed of and/or include an insulating material.

Figure 7:
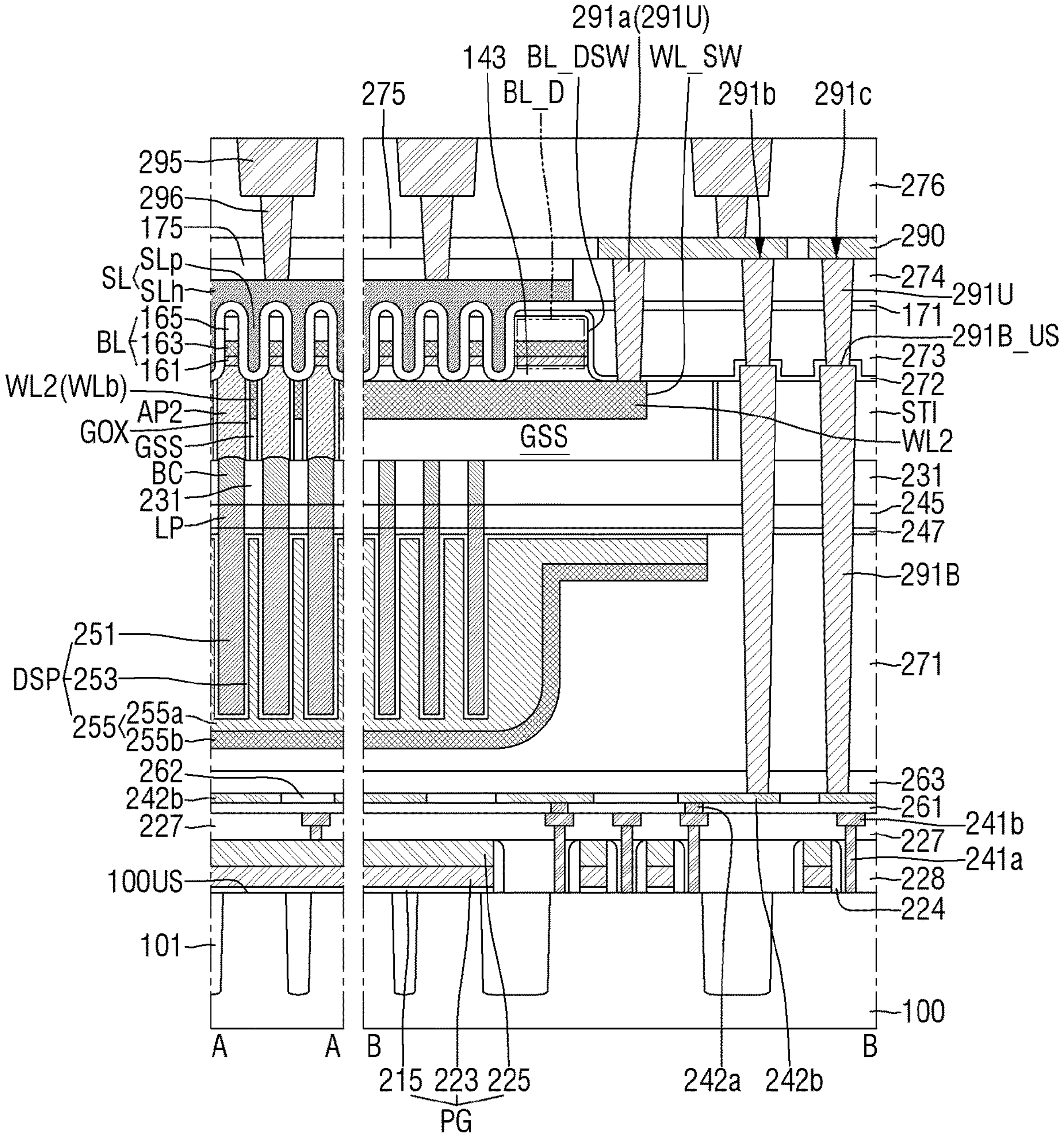
FIGS. 7 and 8 are diagrams for explaining a semiconductor memory device according to some embodiments.
Figure 8:
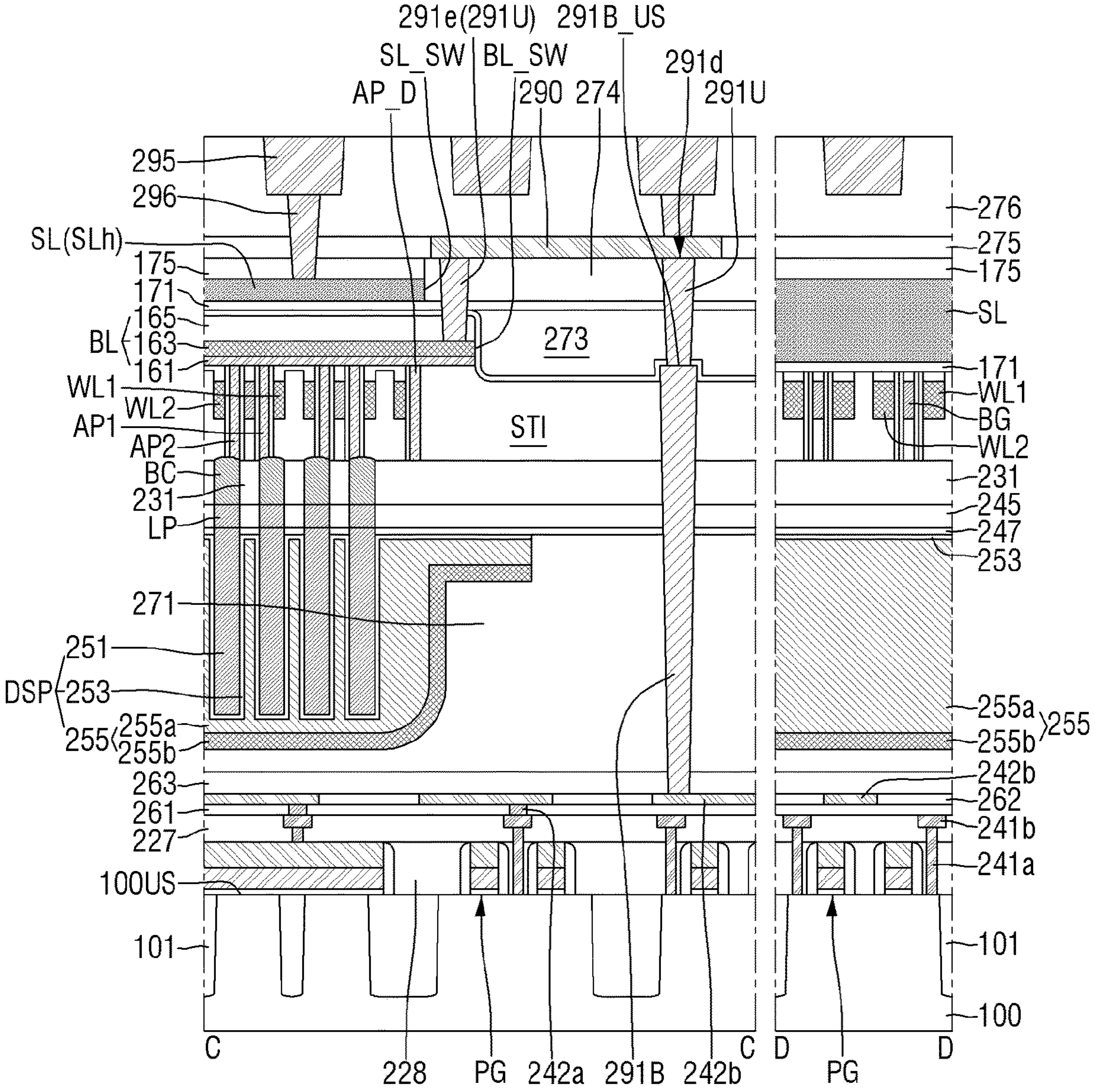
Figure 9:
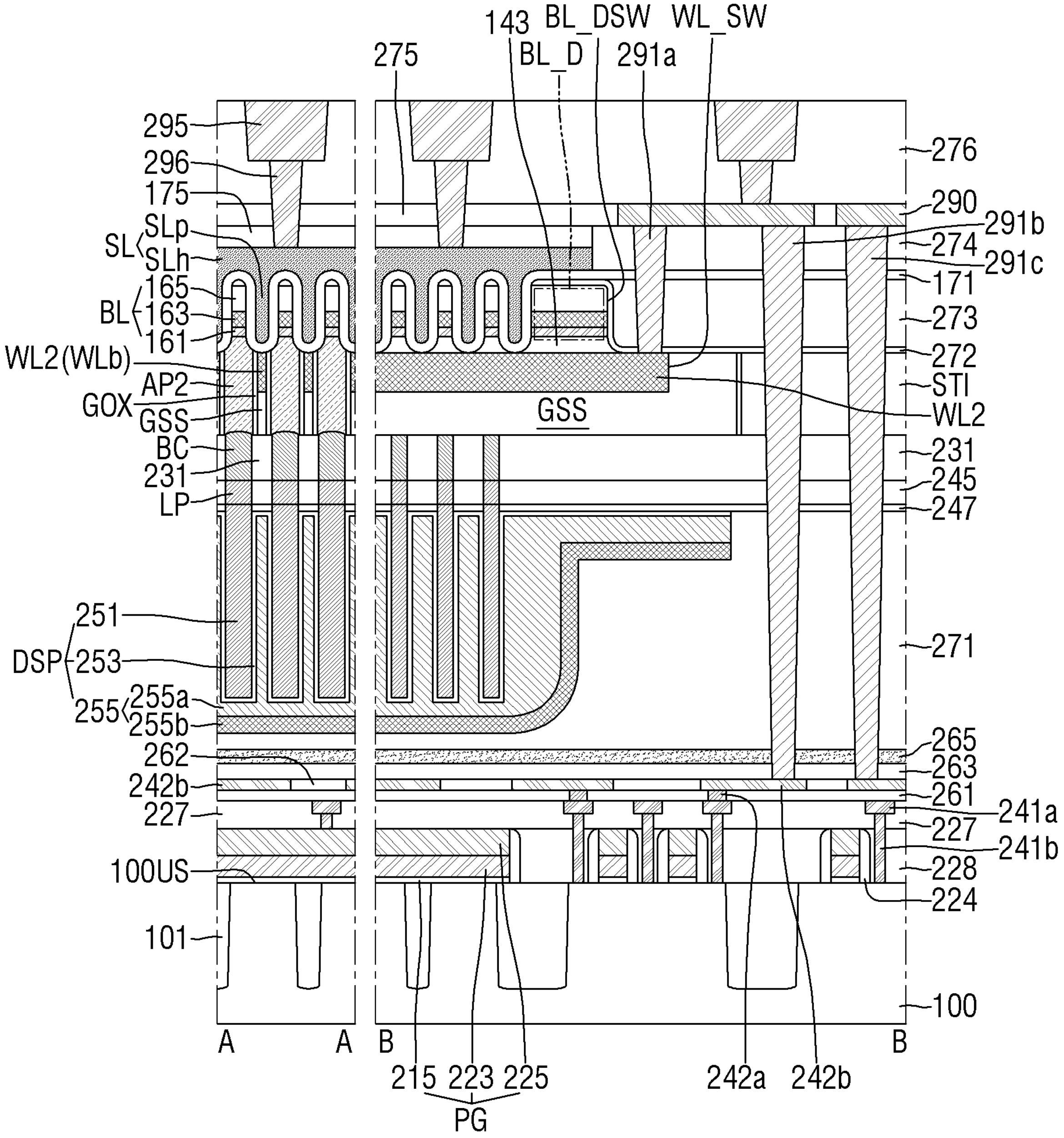
FIGS. 9 and 10 are diagrams for explaining the semiconductor memory device according to some embodiments.
Figure 10:
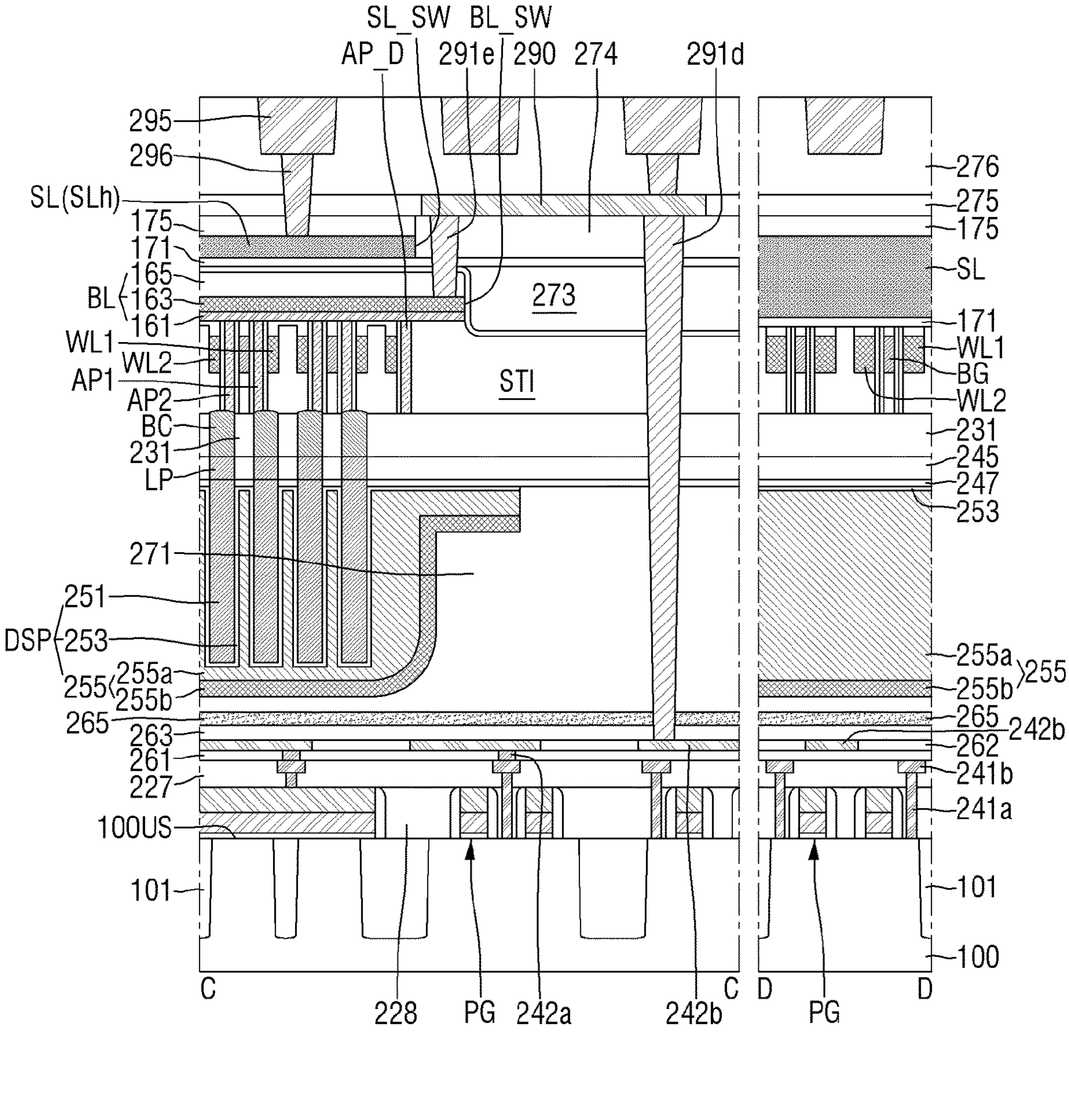
Figure 11:
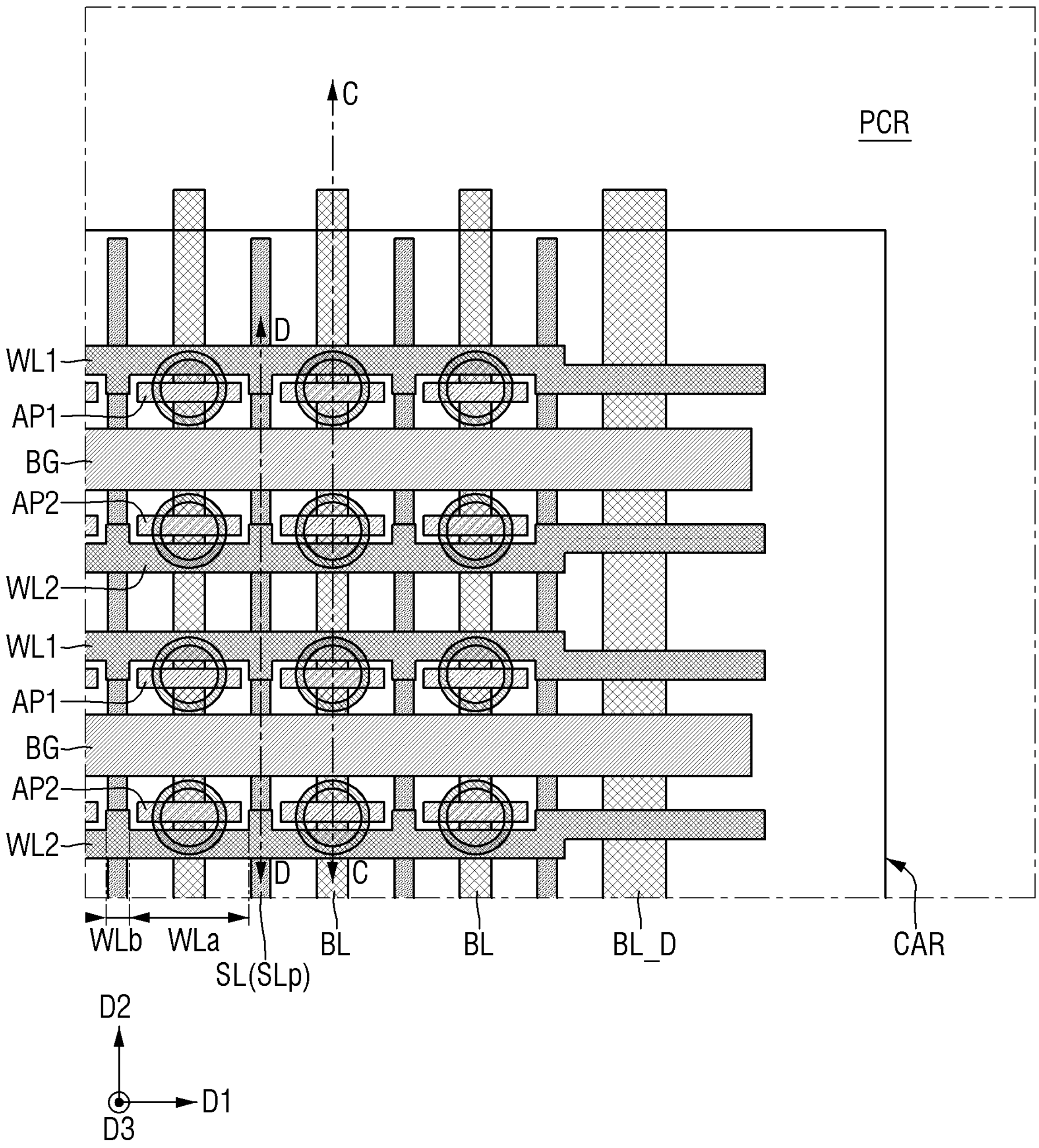
FIGS. 11 and 12 are diagrams for explaining the semiconductor memory device according to some embodiments.
Figure 12:
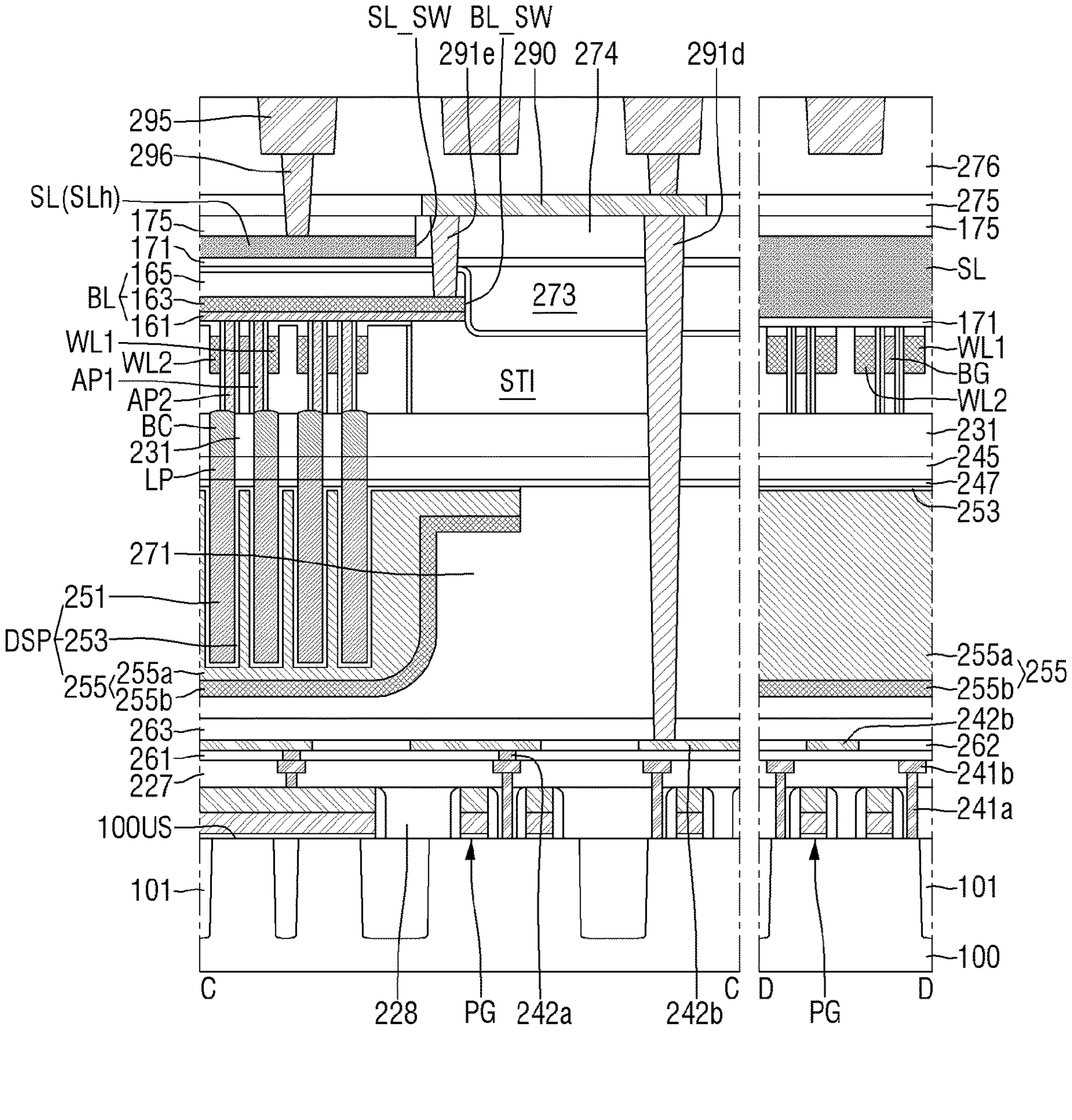

FIGS. 7 and 8 are diagrams for explaining a semiconductor memory device according to some embodiments. FIGS. 9 and 10 are diagrams for explaining the semiconductor memory device according to some embodiments. FIGS. 11 and 12 are diagrams for explaining the semiconductor memory device according to some embodiments. For convenience of explanation, components and relations similar to those described previously may not be described in further detail while components and relations that are different from those explained using FIGS. 1 to 6 may be described in further detail. For reference, FIG. 12 is a cross-sectional view taken along C-C and D-D of FIG. 11.

Referring to FIGS. 7 and 8, in the semiconductor memory device according to some embodiments, the second peri-connecting vias 291*a*, 291*b*, 291*c*, 291*d* and 291*e* may include a lower peri-connecting via 291B and an upper peri-connecting vias 291U.

Some of the second peri-connecting vias 291*a*, 291*b*, 291*c*, 291*d* and 291*e* may include a lower peri-connecting via 291B and an upper peri-connecting via 291U. The rest of the second peri-connecting vias 291*a*, 291*b*, 291*c*, 291*d* and 291*e* may include only the upper peri-connecting via 291U.

The upper peri-connecting via 291U may be disposed between the lower peri-connecting via 291B and the second peri-connecting wiring 290. The upper peri-connecting via 291U may be disposed on the upper surface 291B_US of the lower peri-connecting via.

In the fabricating process, the upper peri-connecting vias 291U may be formed, for example, before the bit line BL is formed. The upper surface 291B_US of the lower peri-connecting via may be lower than the uppermost part of the bit line BL relative to the upper side 100US of the substrate. For example, the upper surface 291B_US of the lower peri-connecting via may be lower than the upper surface of the bit line mask pattern 165 relative to the upper side 100US of the substrate.

The upper peri-connecting via 291U and the lower peri-connecting via 291B may each be formed of and/or include a conductive material.

Referring to FIGS. 9 and 10, the semiconductor memory device according to some embodiments may further include a bonding insulating film 265 disposed between the first peri-connecting structures including first peri-connecting via 242*a* and first peri-connecting wiring 242*b* and the data storage pattern DSP.

The bonding insulating film 265 may extend along the boundary between the fifth peri-lower insulating film 263 and the first peri-upper insulating film 271. The bonding insulating film 265 may be formed of and/or include, for example, silicon carbonitride (SiCN).

Referring to FIGS. 11 and 12, in the semiconductor memory device according to some embodiments, the dummy active patterns (AP_D of FIGS. 2 and 4) are not disposed along the boundary of the cell array region CAR.

The dummy word line disposed on the dummy active pattern AP_D may not be disposed along the boundary of the cell array region CAR, that is, along the side wall of the cell region element isolation film STI. Unlike the shown example, the dummy word line may extend along the boundary of the cell array region CAR.

FIGS. 13 to 16 are diagrams for explaining a semiconductor memory device according to some embodiments. For convenience of explanation, components and relations similar to those described previously may not be described in further detail while components and relations that are different from those explained using FIGS. 1 to 6 may be described in greater detail.

Figure 13:
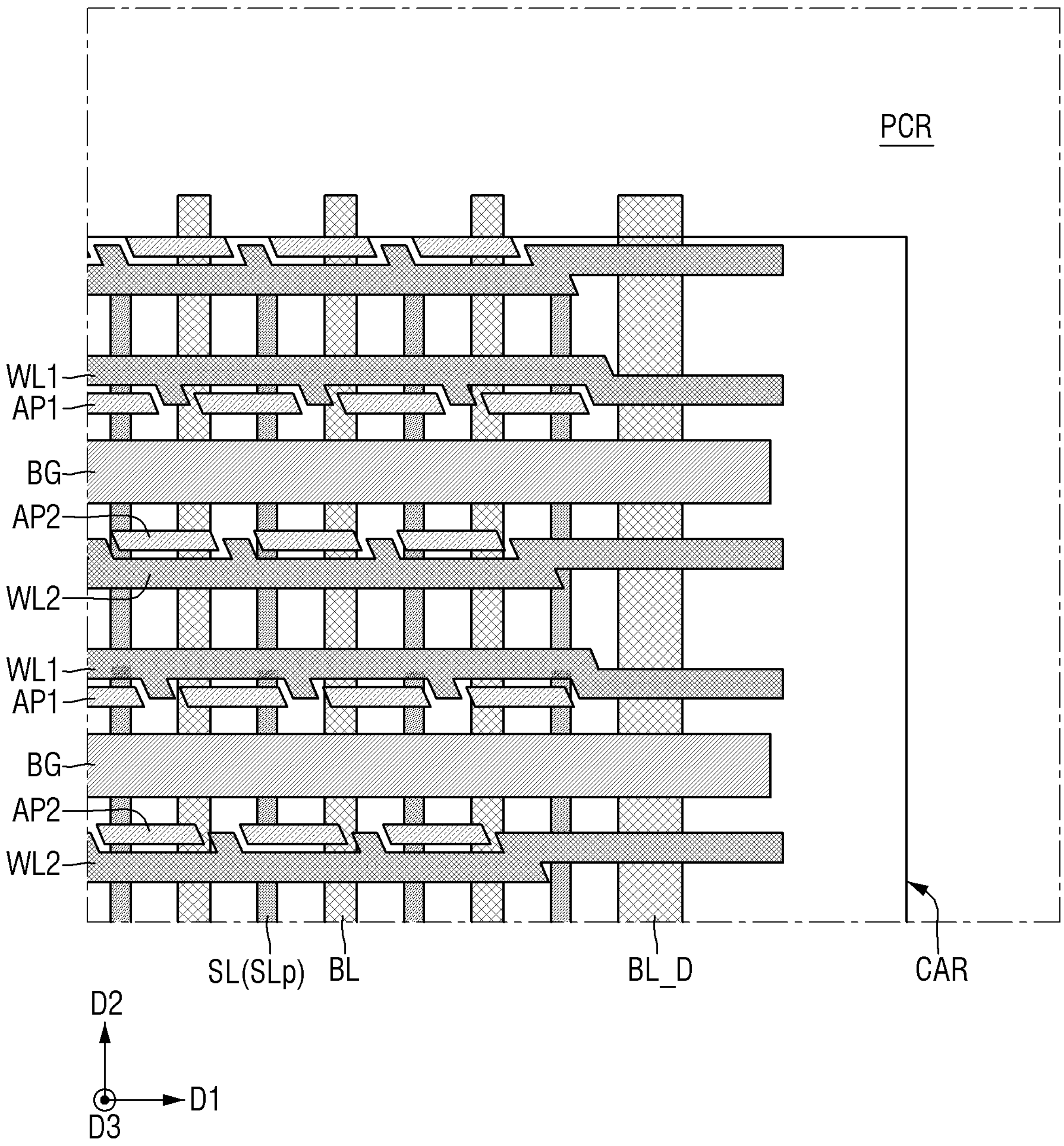
FIGS. 13 to 16 are diagrams for explaining a semiconductor memory device according to some embodiments.

Referring to FIG. 13, in the semiconductor memory device according to some embodiments, the first and second active patterns AP1 and AP2 may be alternately arranged in a diagonal direction with respect to the first direction D1 and the second direction D2 (e.g., the first and second active patterns AP1 and AP2 may alternate in a diagonal direction).

From a planar point of view, each of the first and second active patterns AP1 and AP2 may have a parallelogram or rhombus shape. Since the first and second active patterns AP1 and AP2 are disposed in the diagonal direction, it is possible to reduce coupling between the first and second active patterns AP1 and AP2 facing each other in the second direction D2.

Figure 14:
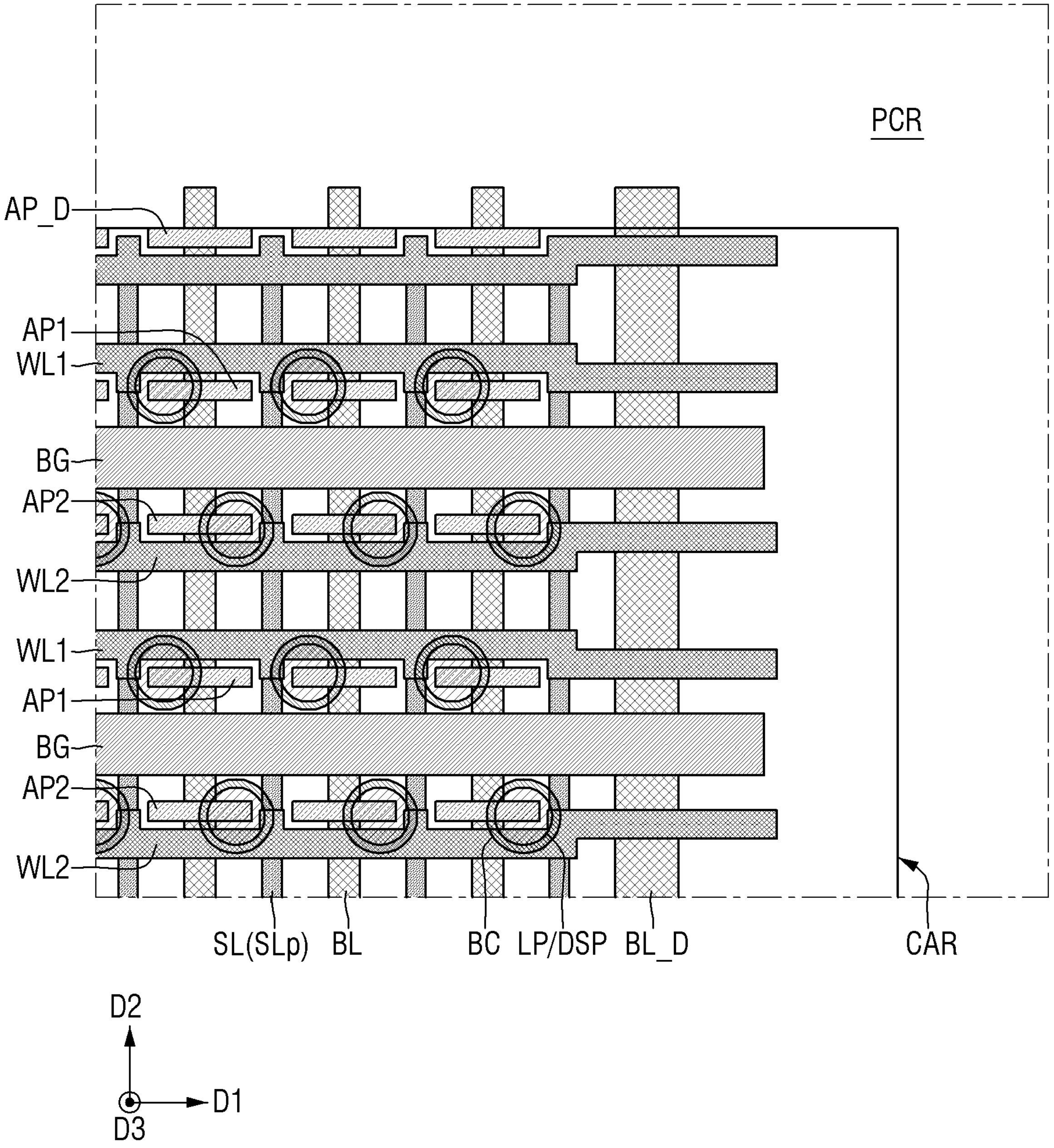

Referring to FIG. 14, in the semiconductor memory device according to some embodiments, the landing pads LP and the data storage patterns DSP may be arranged in the form of zigzag or honeycomb from a planar point of view.

Figure 15:
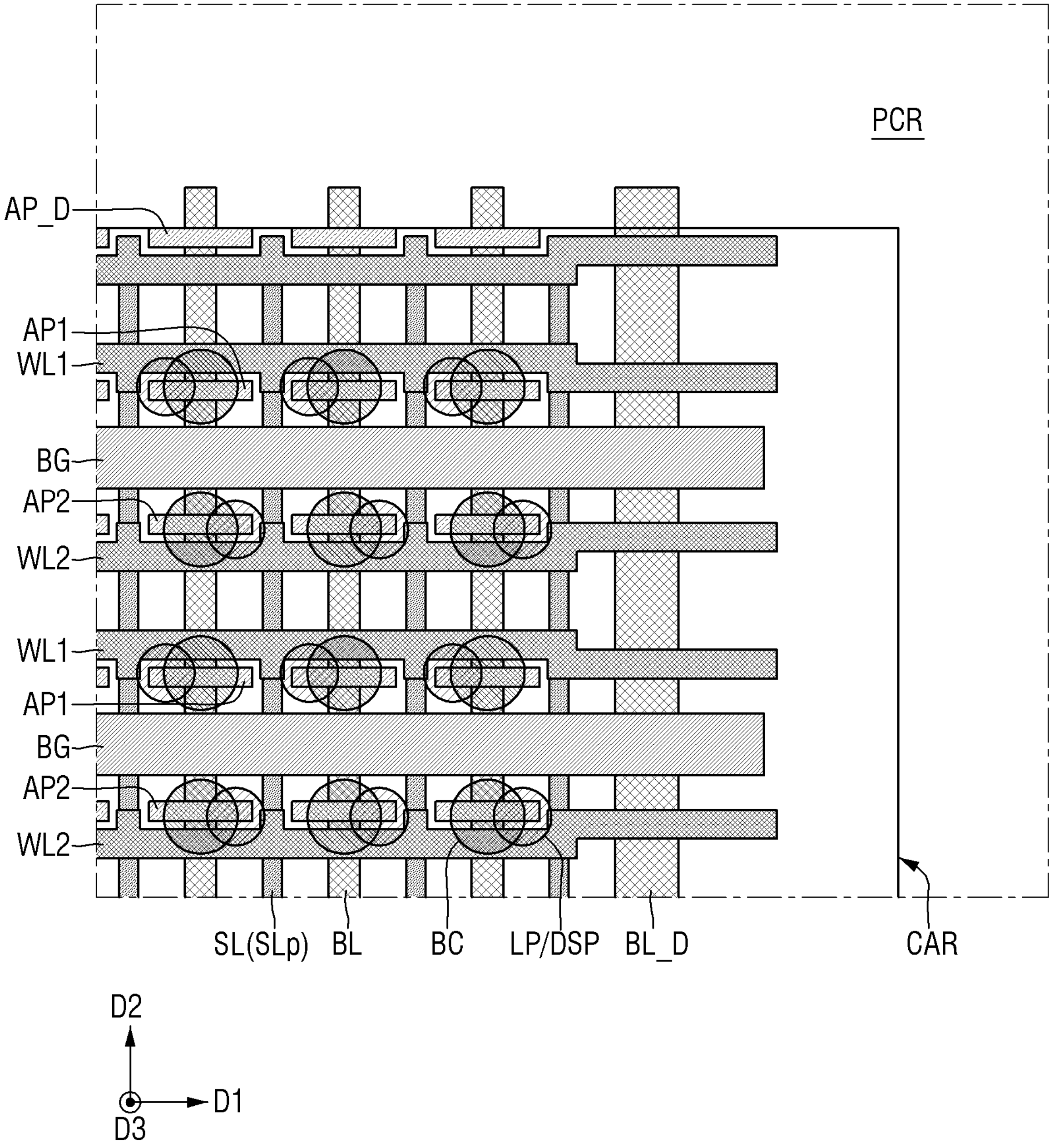

Referring to FIG. 15, in the semiconductor memory device according to some embodiments, the data storage patterns DSP may be disposed to be misaligned from the landing pads LP from a planar point of view.

Each data storage pattern DSP may be in contact with a part of the landing pad LP.

Figure 16:
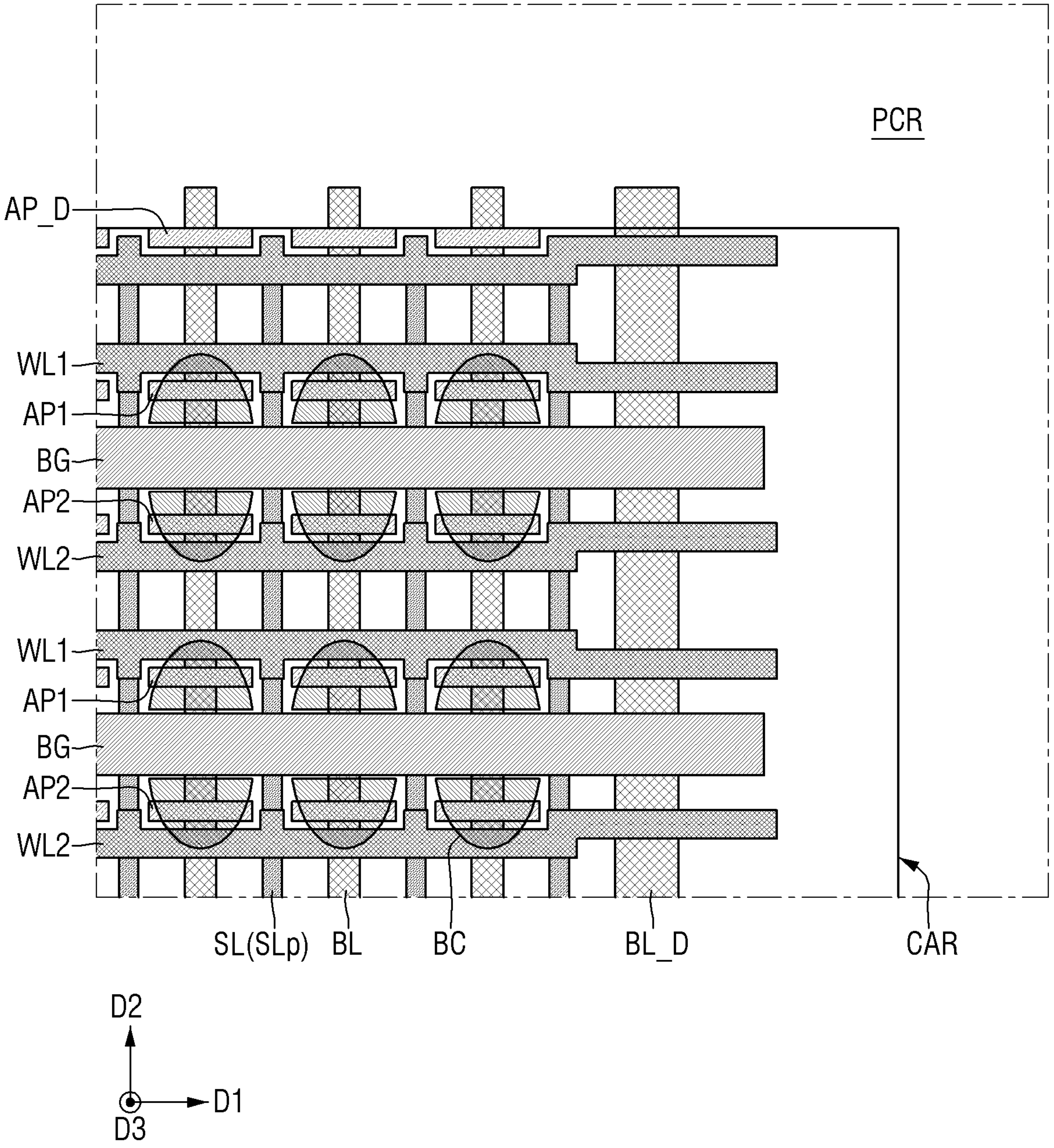

Referring to FIG. 16, in the semiconductor memory device according to some embodiments, each of the contact patterns BC disposed on the first and second active patterns AP1 and AP2 may have a semicircular shape or a semielliptical shape from a planar point of view.

The contact patterns BC may be disposed symmetrically with respect to each other with the back gate electrode BG interposed therebetween from a planar point of view.

FIGS. 17 to 41 are diagrams for explaining a method for fabricating a semiconductor memory device according to some embodiments. The semiconductor memory device described using FIGS. 1 to 6 may be fabricated, accordingly.

Figure 17:
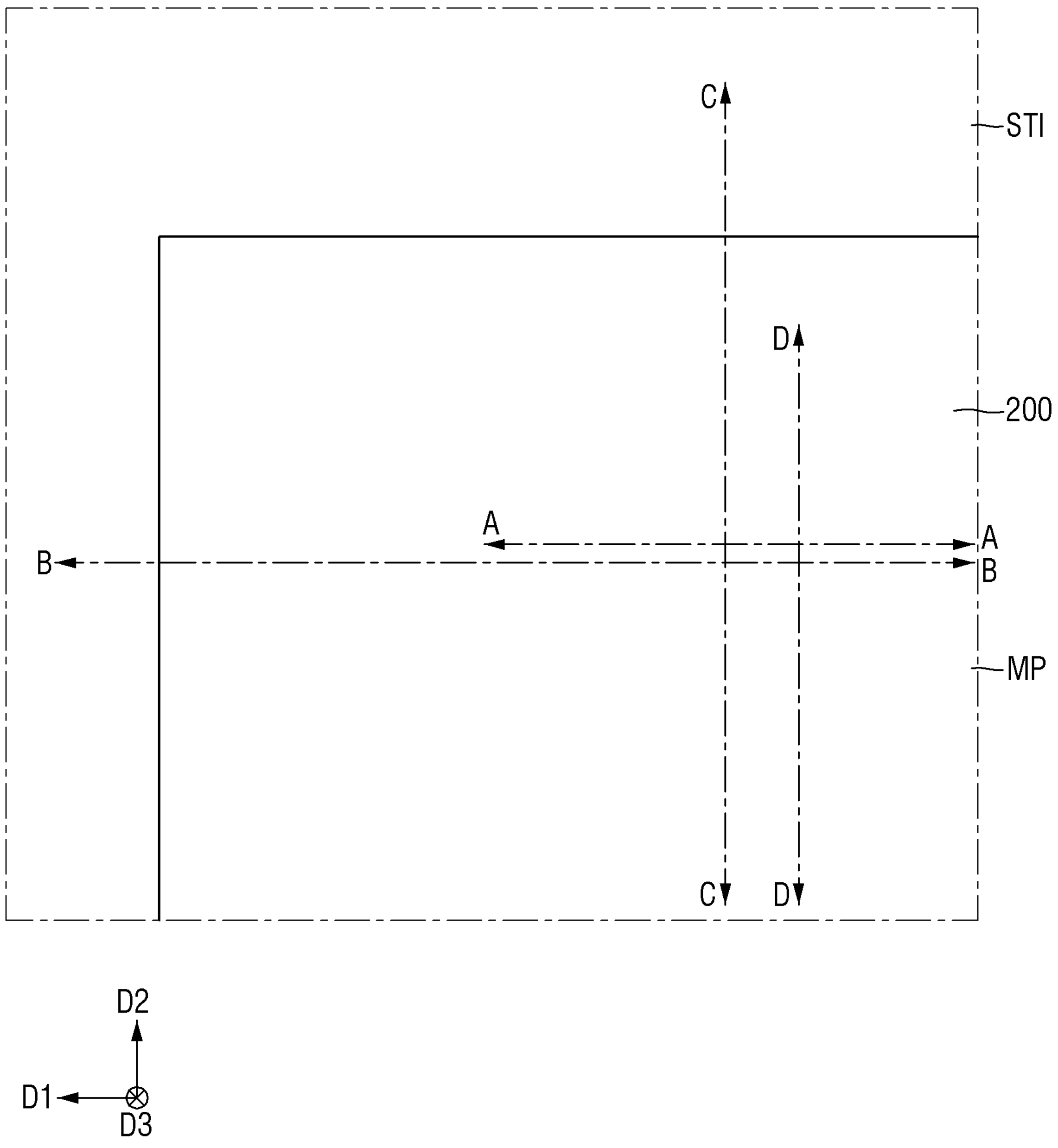
FIGS. 17 to 41 are diagrams for explaining a method for fabricating a semiconductor memory device according to some embodiments.
Figure 18:
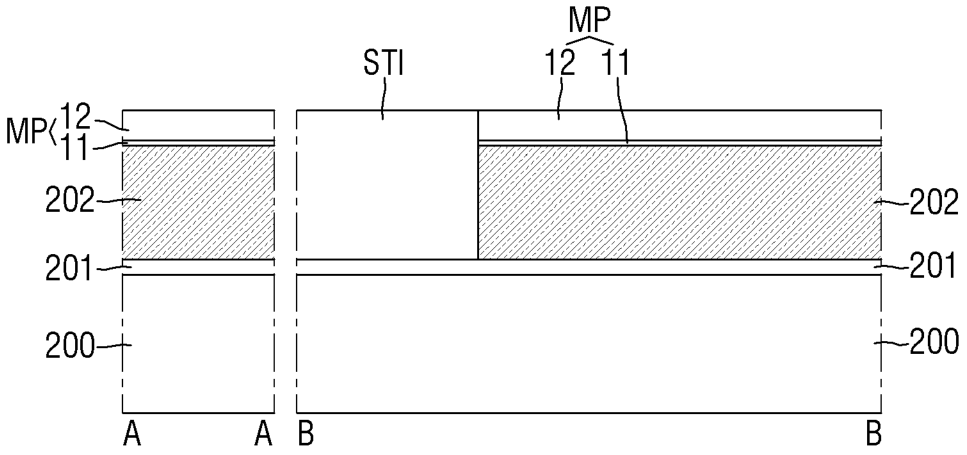
Figure 19:
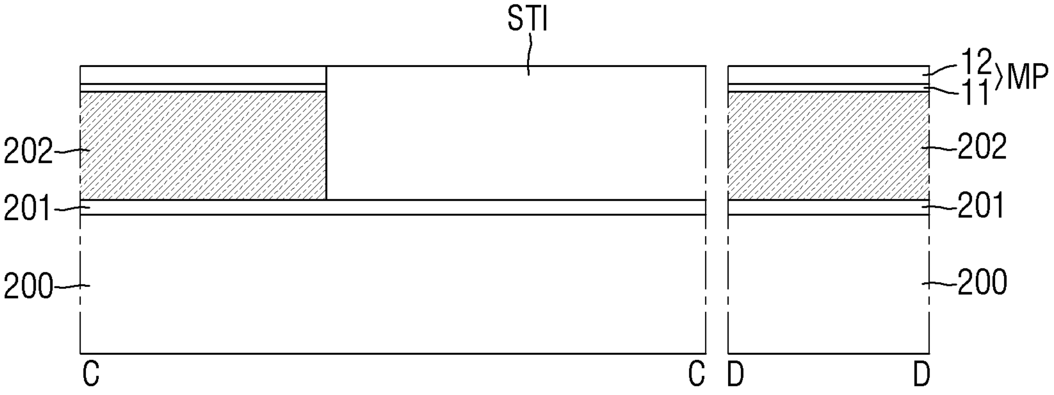

Referring to FIGS. 17 to 19, a sub-substrate structure including a sub-substrate 200, a buried insulating film 201, and an active layer 202 may be provided.

The buried insulating film 201 and the active layer 202 may be provided on the sub-substrate 200. The sub-substrate 200, the buried insulating film 201 and the active layer 202 may be silicon-on-insulator substrates (i.e., SOI substrates).

The sub-substrate 200 may include a cell array region CAR and a peripheral circuit region PCR. The sub-substrate 200 may be, for example, a silicon substrate, a germanium substrate, and/or a silicon-germanium substrate.

The buried insulating film 201 may be a buried oxide (BOX) formed by a SIMOX (separation by implanted oxygen) method or a bonding and layer transfer method. In contrast, the buried insulating film 201 may be an insulating film formed by a chemical vapor deposition method. The buried insulating film 201 may include, for example, a silicon oxide film, a silicon nitride film, a silicon oxynitride film, and/or a low dielectric constant insulating film.

The active layer 202 may be a single crystal semiconductor film. The active layer 202 may be, for example, a single crystal silicon substrate, a germanium substrate, and/or a silicon-germanium substrate. The active layer 202 may have a first surface and a second surface that are opposite to each other in the third direction D3, and the second surface of the active layer 202 may be in contact with the buried insulating film 201.

A mask pattern MP may then be formed on the active layer 202. The mask pattern MP may include a lower mask film 11 and an upper mask film 12 that are sequentially stacked. The upper mask film 12 may be made of a material having etching selectivity with respect to the lower mask film 11. As an example, the lower mask film 11 may be formed of and/or include silicon oxide, and the upper mask film 12 may include, but is not limited to, silicon nitride.

Subsequently, a cell region element isolation film STI may be formed inside the active layer 202 of the peripheral circuit region PCR. The cell region element isolation film STI may be formed by patterning the active layer 202 of the peripheral circuit region PCR to form an element isolation trench that exposes the buried insulating film 201, and then burying an insulating material inside the element isolation trench. The cell region element isolation film STI may be formed to define the cell array region CAR. The upper surface of the cell region element isolation film STI may be substantially coplanar with the upper surface of the mask pattern MP.

Figure 20:
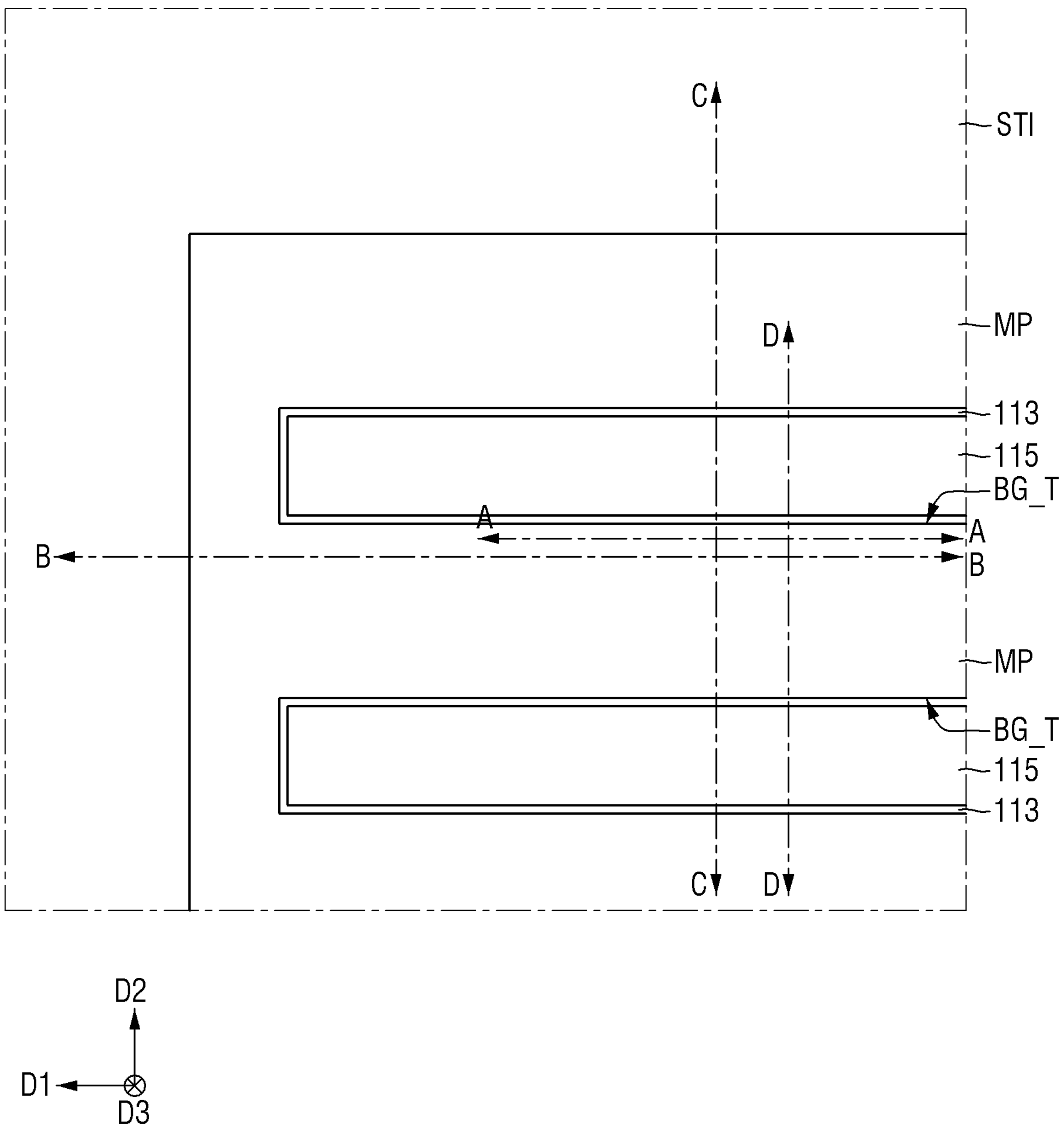
Figure 21:
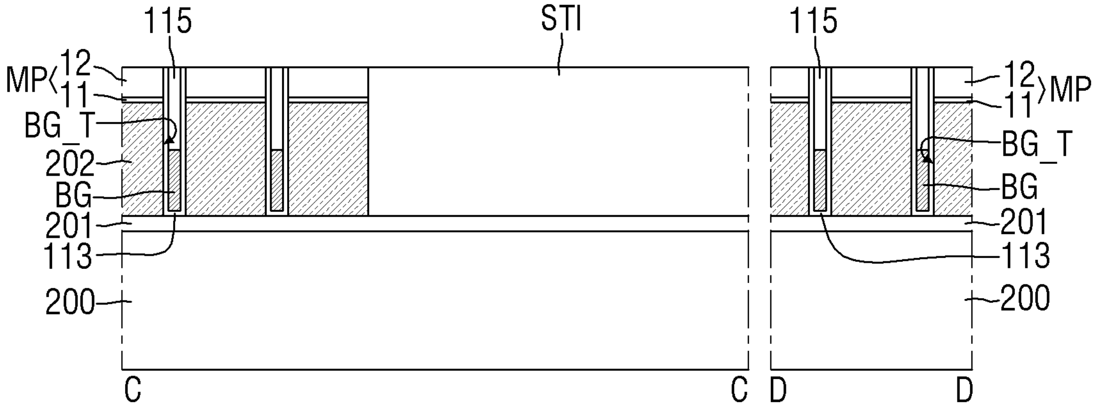
Figure 22:
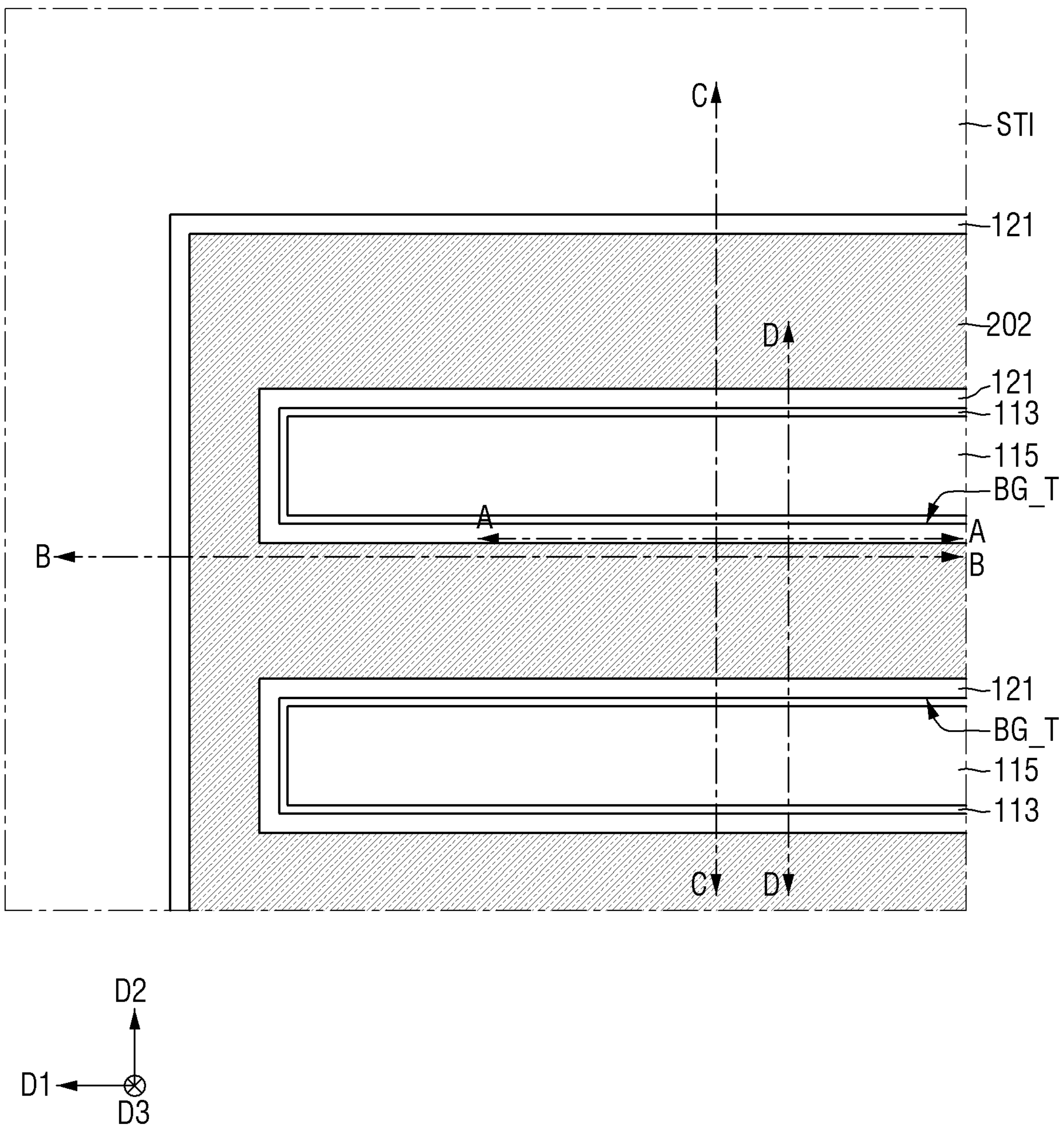
Figure 23:
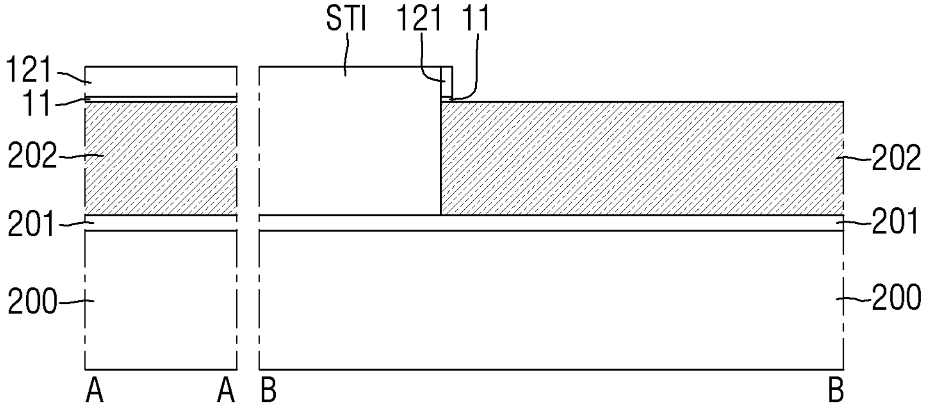
Figure 24:
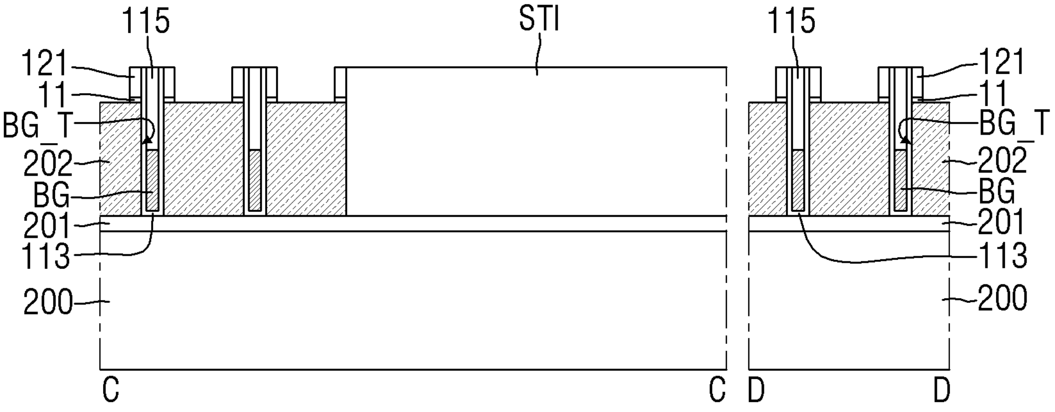
Figure 25:
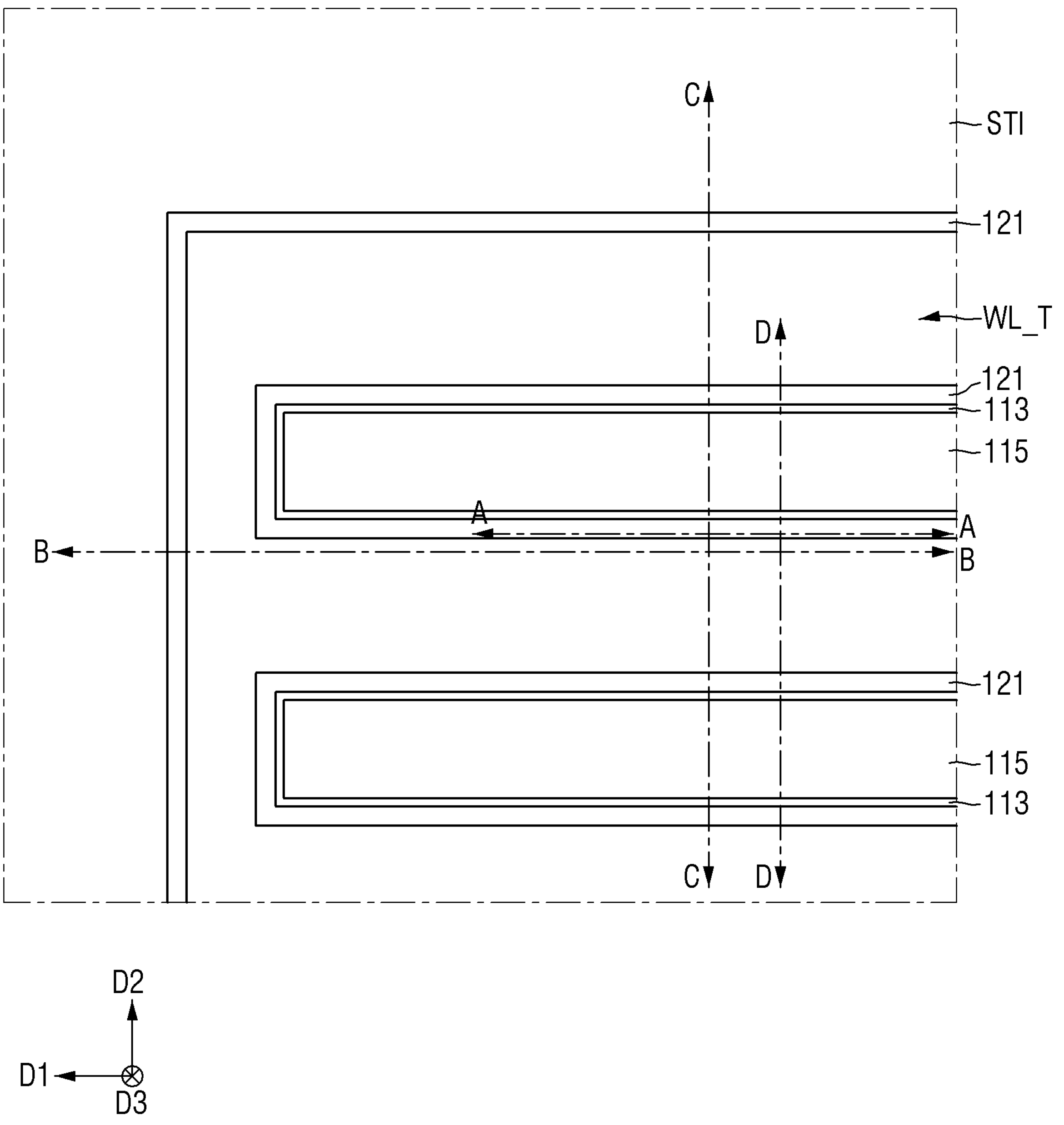
Figure 26:
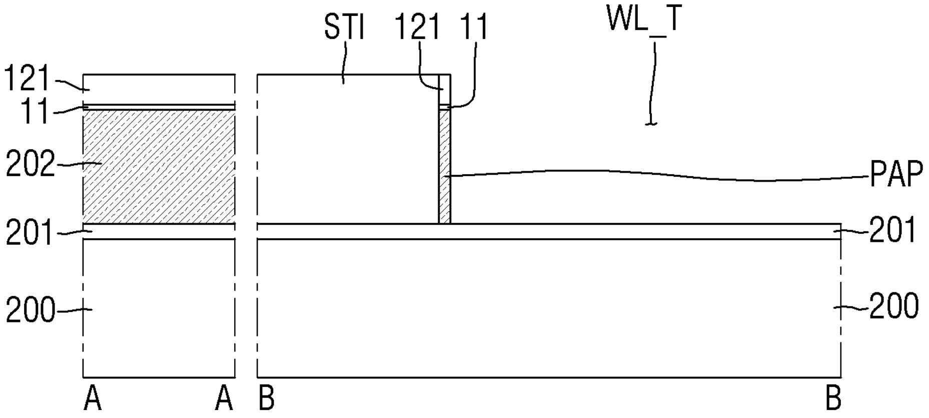
Figure 27:
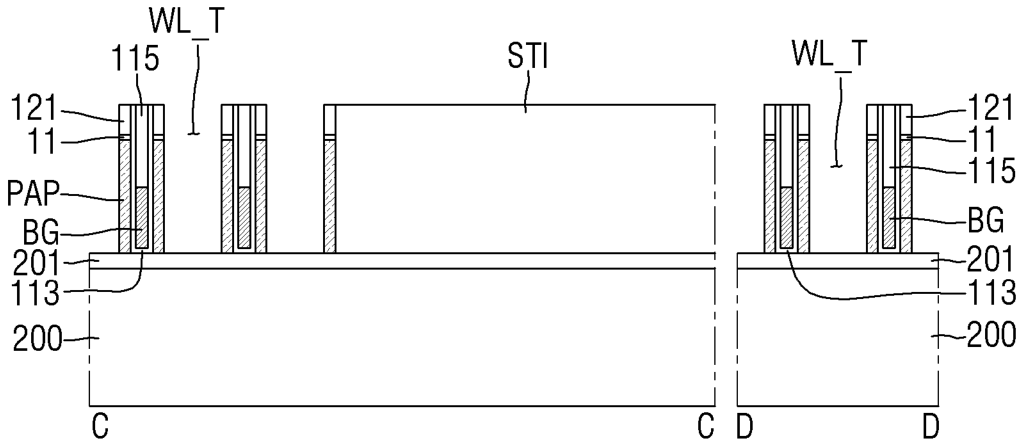
Figure 28:
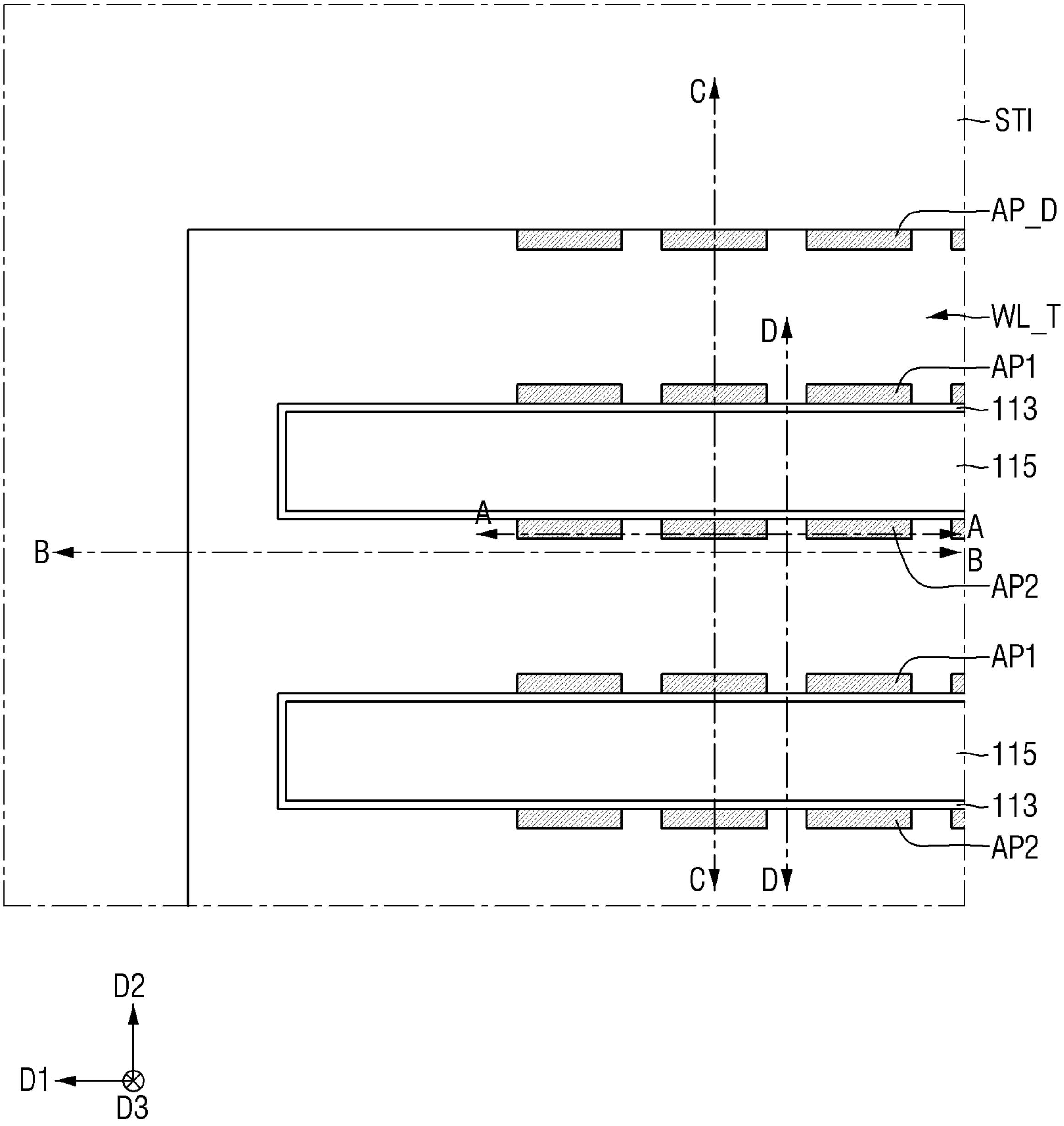
Figure 29:
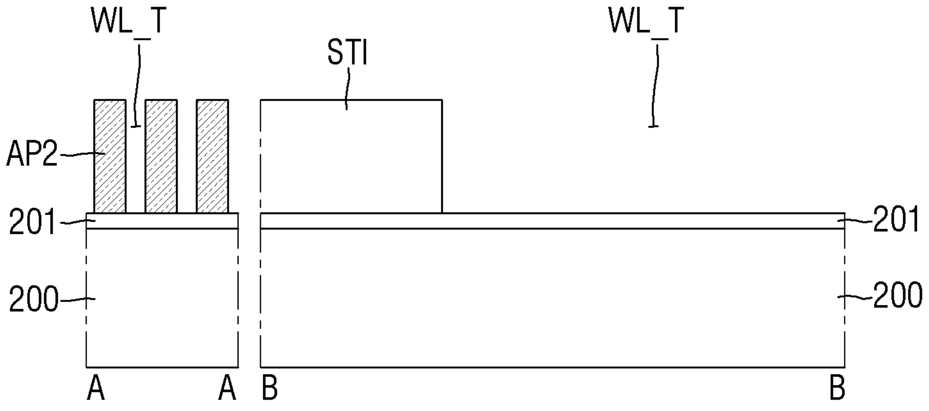
Figure 30:
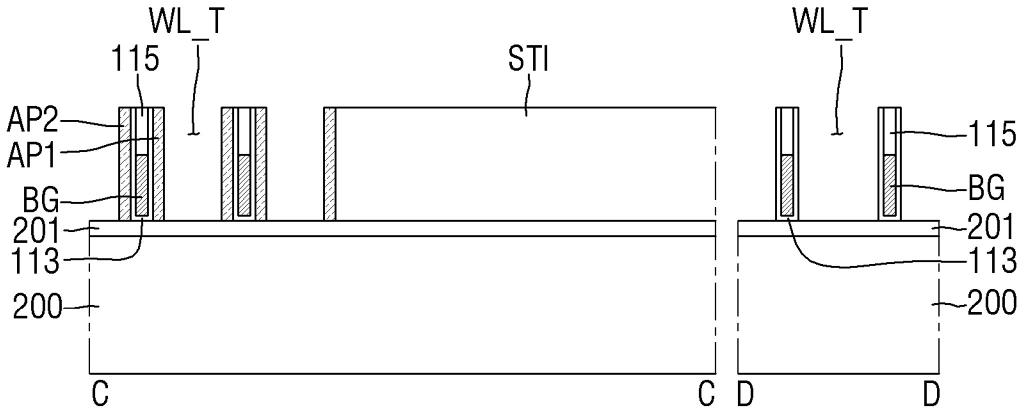

Referring to FIGS. 20 and 21, the active layer 202 of the cell array region CAR may be etched anisotropically.

Accordingly, the back gate trenches BG_T extending in the first direction D1 may be formed on the active layer 202 of the cell array region CAR. The back gate trenches BG_T may expose the buried insulating film 201, and may be spaced apart at constant intervals in the second direction D2.

Unlike the shown example, at least a part of the buried insulating film 201 may be removed, while the back gate trenches BG_T are being formed.

The back gate insulating pattern 113 and the back gate electrodes BG may then be formed inside the back gate trench BG_T.

More specifically, the back gate insulating pattern 113 may be formed along the side walls and bottom surface of the back gate trench BG_T and the upper surface of the back gate mask pattern MP. The back gate conductive film may be formed on the back gate insulating pattern 113. The back gate conductive film may fill the back gate trench BG_T. Subsequently, the back gate conductive film may be etched to form the back gate electrodes BG extending in the first direction D1. The back gate electrodes BG may fill a part of the back gate trench BG_T.

Meanwhile, according to some embodiments, a gas phase doping (GPD) process or a plasma doping (PLAD) process may be performed before forming the back gate insulating pattern 113. The active layer 302 exposed by the back gate trench BG_T may be doped with impurities through the aforementioned process.

The back gate capping patterns 115 may then be formed on the back gate electrode BG.

The back gate capping pattern 115 may fill the rest of the back gate trench BG_T. If the back gate capping pattern 115 and the back gate insulating pattern 113 are made up of the same material (e.g., silicon oxide), the back gate insulating pattern 113 on the upper surface of the back gate mask pattern MP may be removed, while the back gate capping pattern 115 is being formed.

Meanwhile, before forming the back gate capping pattern 115, a gas phase doping (GPD) process or a plasma doping (PLAD) process may be performed. Impurities may be doped into the active layer 302 through the back gate trench BG_T in which the back gate electrode BG is formed, accordingly.

A cross-sectional view taken along A-A and B-B of FIG. 20 may be the same as that of FIG. 18.

Referring to FIGS. 20 to 24, after forming the back gate capping patterns 115, the upper mask film 12 may be removed.

The back gate capping patterns 115 may have a form protruding upward above the upper surface of the lower mask film 11.

A pair of spacer patterns 121 may then be formed on side walls of the back gate insulating pattern 113.

More specifically, the spacer film may be formed along the upper surface of the lower mask film 11, the side walls of the back gate insulating patterns 113, and the upper surfaces of the back gate capping patterns 115. The spacer film may be formed at a uniform thickness. A spacer pattern 121 may be formed by performing an anisotropic etching process on the spacer film. The active layer 202 may be exposed, while the spacer pattern 121 is being formed.

The widths of the active patterns of the vertical channel transistors may be determined, depending on a deposited thickness of the spacer film. The spacer film may be made up of an insulating material. The spacer film may include, for example, silicon oxide, silicon oxynitride, silicon nitride, silicon carbide (SiC), silicon carbon nitride film (SiCN), combinations thereof, and the like.

Referring to FIGS. 22 to 27, an anisotropic etching process may be performed on the active layer 202, using the spacer pattern 121 as an etching mask.

The pre-active patterns PAP that surround each back gate electrode BG may be formed, accordingly. As the pre-active patterns PAP are formed, the buried insulating film 201 may be exposed. The pre-active pattern PAP may be formed along side walls of the cell region element isolation film STI.

The pre-active patterns PAP may have a loop shape formed along the periphery of the back gate electrode BG. A word line trench WL_T may be formed between the pre-active patterns PAP adjacent to each other.

Referring to FIGS. 25 to 30, a sacrificial film that fills the word line trench WL_T may be formed.

An active mask pattern may be formed on the sacrificial film. The active mask pattern may have a line shape extending in the second direction D2. As another example, the active mask pattern may have the line shape extending in a diagonal direction with respect to the first direction D1 and the second direction D2. The sacrificial film may be etched using the active mask pattern as an etch mask to form sacrificial openings in the sacrificial film.

By etching the pre-active patterns PAP exposed to the sacrificial openings, a first active pattern AP1 and a second active pattern AP2 may be formed on both sides of the back gate electrode BG. The first active patterns AP1 may be formed to be spaced apart from each other in the first direction D1 on the first side walls of the back gate electrode BG. The second active patterns AP2 may be formed to be spaced apart from each other in the first direction D1 on the second side walls of the back gate electrode BG. Since the first active pattern AP1 and the second active pattern AP2 are formed, the sacrificial openings may expose a part of the back gate insulating pattern 113.

Thereafter, the sacrificial film, the active mask pattern, the spacer pattern 121 and the lower mask film 11 may be removed. The first active pattern AP1 and the second active pattern AP2 may be exposed, accordingly. Also, the buried insulating film 201 may be exposed.

A dummy active pattern AP_D may be formed on the side wall of the cell region element isolation film STI, while the first active pattern AP1 and the second active pattern AP2 are being formed. The dummy active pattern may not be formed on the side walls of the cell region element isolation film STI, unlike the shown example.

Figure 31:
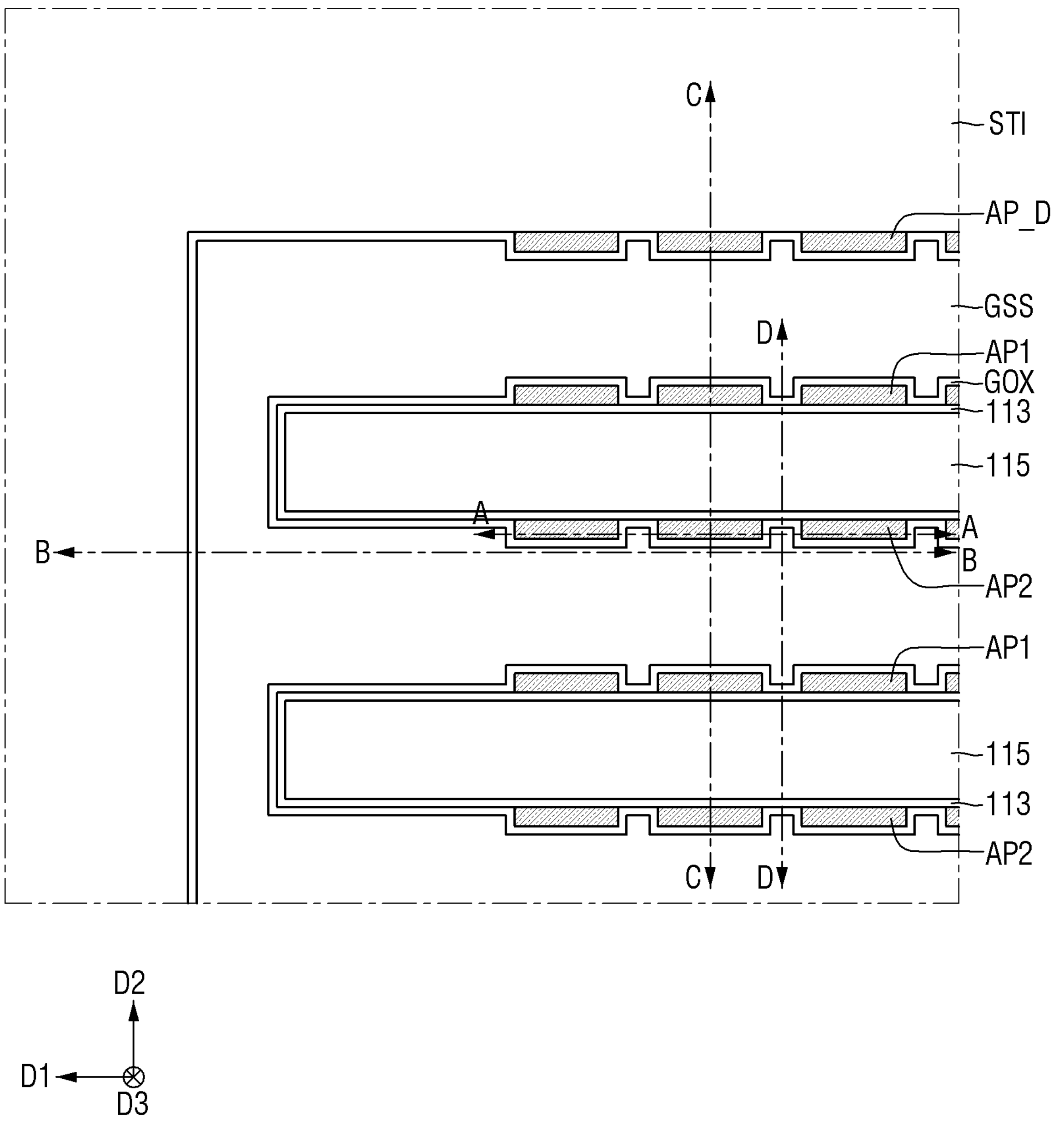
Figure 32:
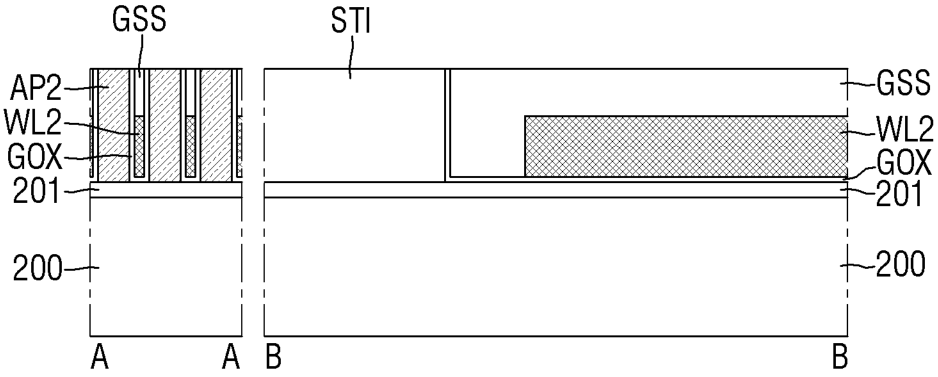
Figure 33:
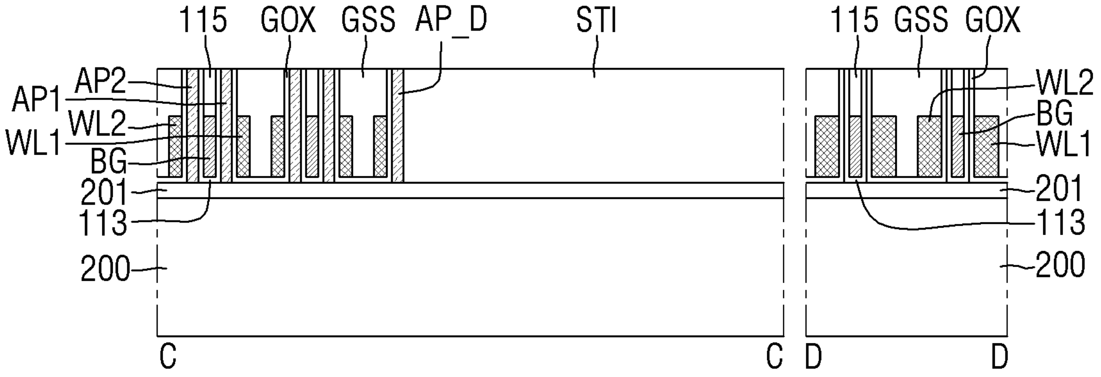

Referring to FIGS. 31 to 33, the gate insulating pattern GOX may be formed along the side walls of the first active pattern AP1, the side walls of the second active pattern AP2, the upper surface of the back gate capping pattern 115, and the upper surface of the buried insulating film 201.

The gate insulating pattern GOX may be formed, but is not limited to, using at least one of physical vapor deposition (PVD), thermal chemical vapor deposition (thermal CVD), low-pressure chemical vapor deposition (LP-CVD), plasma enhanced chemical vapor deposition (PE-CVD) or atomic layer deposition (ALD) techniques.

Subsequently, a first word line WL1 and a second word line WL2 may be formed on the gate insulating pattern GOX. The first and second word lines WL1 and WL2 may be formed on side walls of the first and second active patterns AP1 and AP2. Dummy word lines may be formed on side walls of the dummy active pattern AP_D.

Formation of the first and second word lines WL1 and WL2 may include a process of performing an anisotropic etching process on the gate conductive film after depositing a gate conductive film on the gate insulating pattern GOX. Here, a deposition thickness of the gate conductive film may be smaller than half a width of the word line trench (WL_T of FIGS. 28 to 30).

At the time of the anisotropic etching process on the gate conductive film, the gate insulating pattern GOX may be used as an etching stop film. Unlike the shown example, the gate insulating pattern GOX may be over-etched to expose the buried insulating film 201. The first and second word lines WL1 and WL2 may have various shapes depending on the anisotropic etching process on the gate conductive film.

The upper surface of the first word line WL1 and the upper surface of the second word line WL2 may be positioned at a level lower than the upper surfaces of the first and second active patterns AP1 and AP2.

As an example, after forming the first and second word lines WL1 and WL2, a gas phase doping (GPD) process or a plasma doping (PLAD) process may be performed. Accordingly, impurities may be doped into the first and second active patterns AP1 and AP2 through the gate insulating patterns GOX exposed by the first and second word lines WL1 and WL2.

Subsequently, the gate isolation pattern GSS may be formed on the first word line WL1 and the second word line WL2. For example, the upper surface of the gate isolation pattern GSS may be disposed on the same plane as the upper surface of the back gate capping pattern 115.

Figure 34:
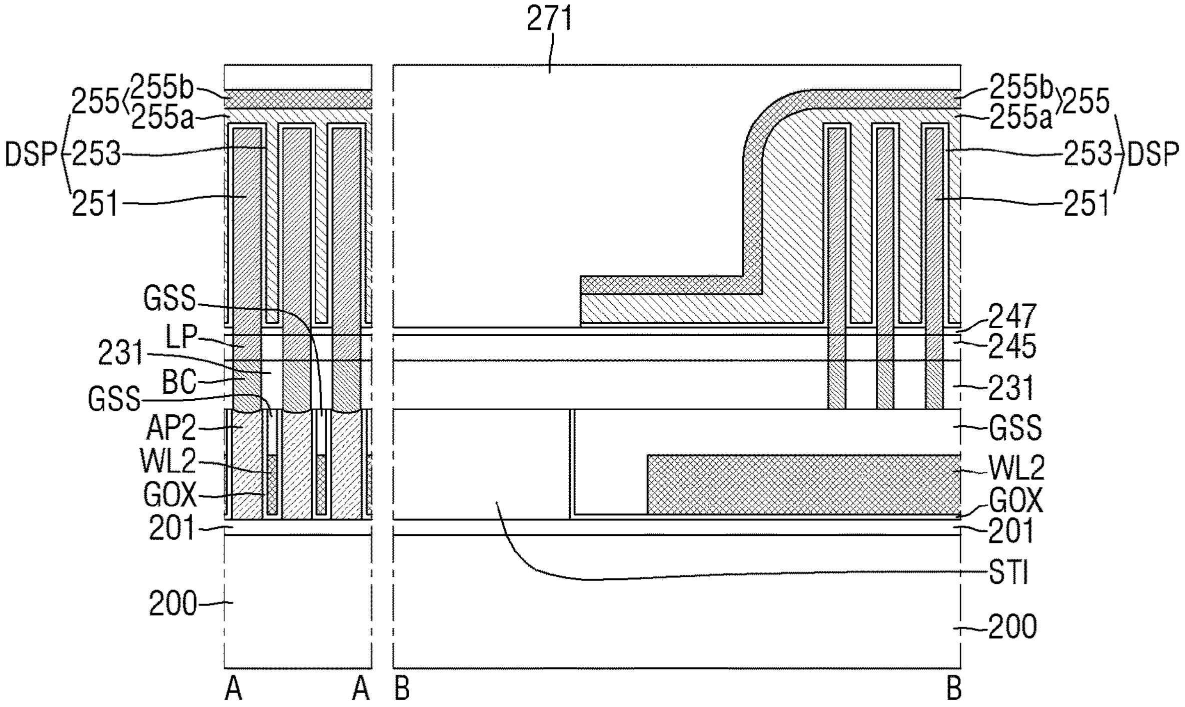
Figure 35:
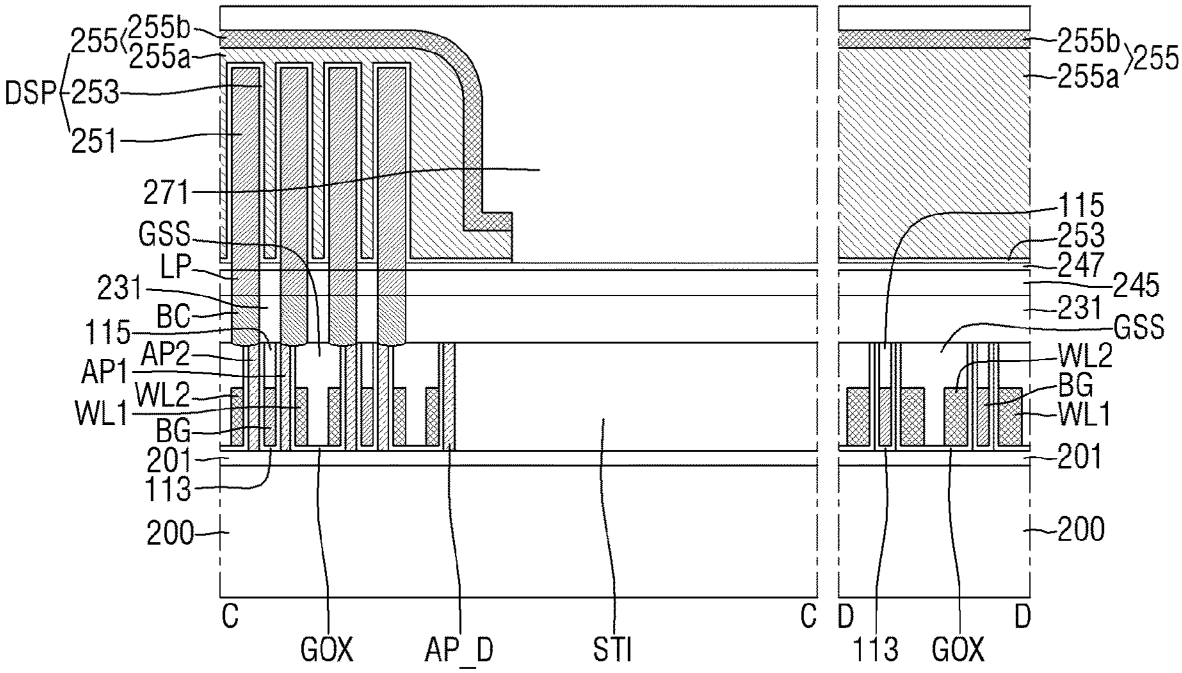

Referring to FIGS. 34 and 35, a contact hole that exposes the first active pattern AP1 and the second active pattern AP2 may be formed inside the contact interlayer insulating film 231.

The contact pattern BC may be formed inside the contact hole. The contact patterns BC may be formed on the first active pattern AP1 and the second active pattern AP2. The contact patterns BC may be connected to the first active pattern AP1 and the second active pattern AP2. A landing pad LP may be formed on the contact pattern BC. Data storage patterns DSP may be formed on the landing pad LP.

Subsequently, a first peri-upper insulating film 271 may be formed on the data storage patterns DSP. The first peri-upper insulating film 271 may cover the data storage pattern DSP.

Although it is not shown, a bonding insulating film (265 of FIGS. 9 and 10) may be formed on the first peri-upper insulating film 271.

Figure 36:
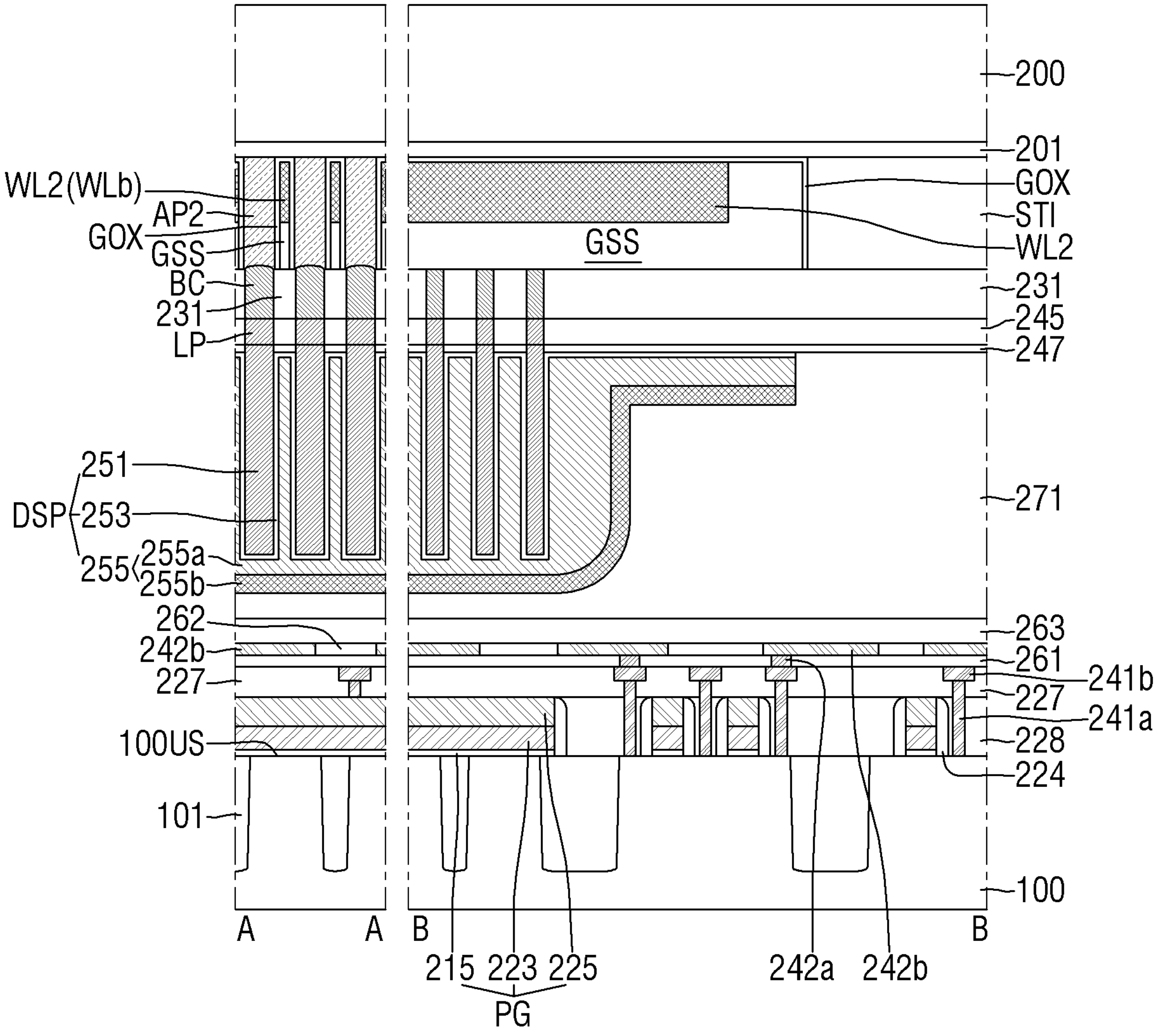
Figure 37:
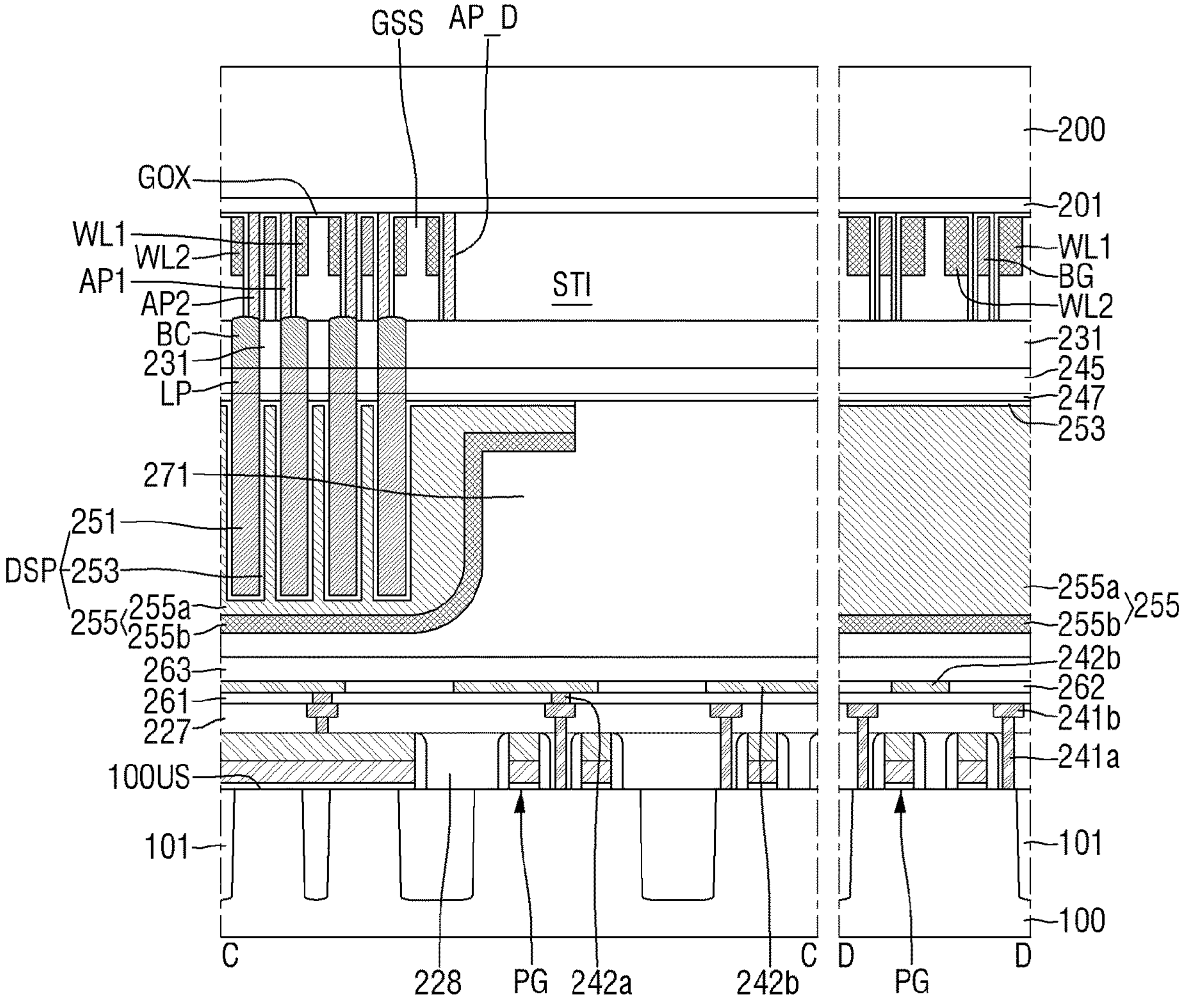
Figure 38:
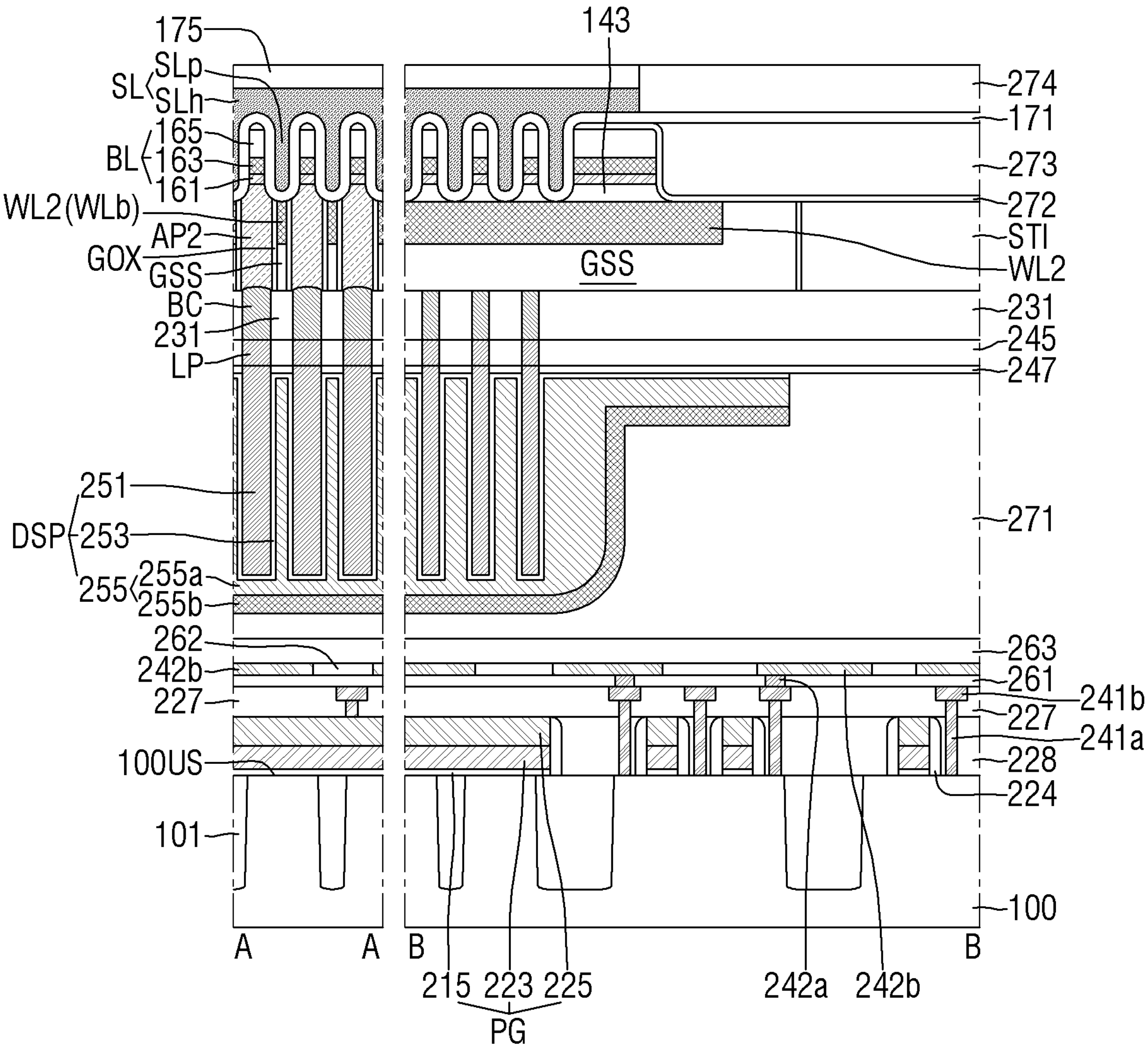
Figure 39:
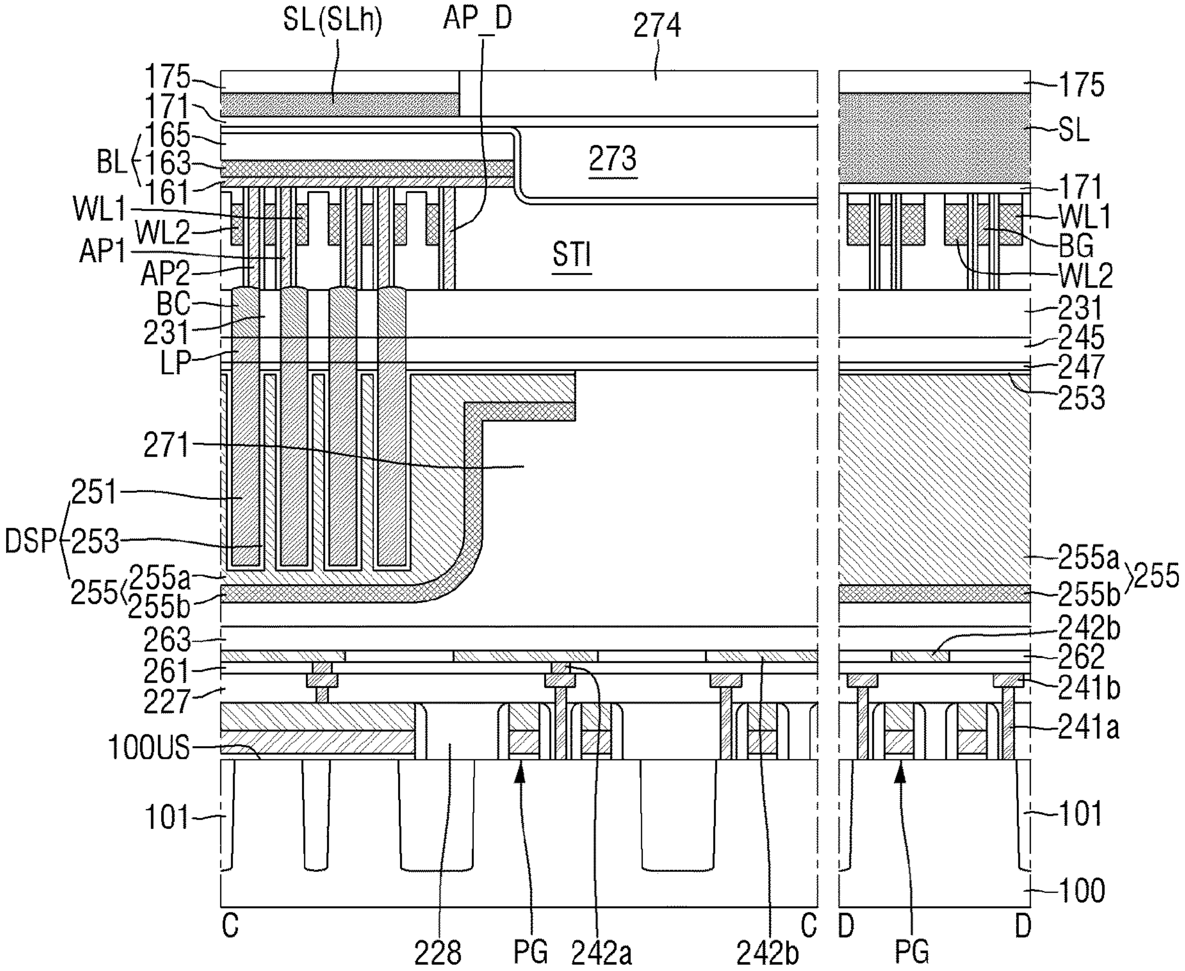

Referring to FIGS. 36 and 37, a sub-substrate 200 on which the back gate electrodes BG, the word lines WL1 and WL2, the active patterns AP1 and AP2, and the date storage patterns DSP are formed may be bonded to the substrate 100.

For example, the substrate 100 on which the peri-gate structure PG and the first peri-connecting structures including first peri-connecting via 242*a* and first peri-connecting wiring 242*b* are formed may be bonded to the sub-substrate 200.

Referring to FIGS. 36 to 39, after bonding the sub-substrate 200 and the substrate 100, a back side lapping process for removing the sub-substrate 200 may be performed.

Removal of the sub-substrate 200 may include a process of exposing the buried insulating film 201 by sequentially performing a grinding process and a wet etching process.

The buried insulating film 201 may then be removed to expose the first active pattern AP1 and the second active pattern AP2.

The buried insulating film 201 may be removed to expose a part of the gate insulating pattern GOX and a part of the back gate insulating pattern 113.

After that, the exposed gate insulating pattern GOX and the exposed back gate insulating pattern 113 may be removed. The back gate electrode BG, the first word line WL1 and the second word line WL2 may be exposed, accordingly.

An etch-back process may then be performed to remove a part of the first word line WL1 and a part of the second word line WL2. The gate capping pattern 143 may be formed on the recessed first and second word lines WL1 and WL2.

The etch-back process may be performed to remove a part of the back gate electrode BG. The back gate isolation pattern 111 may be formed on the recessed back gate electrode BG.

Subsequently, a bit line BL and a dummy bit line BL_D extending in the second direction D2 may be formed on the gate capping pattern 143 and the back gate isolation pattern 111. The bit line BL may include a bit line mask pattern 165, a metal pattern 163, and a semiconductor pattern 161. A part of the gate capping pattern 143 and a part of the gate isolation pattern 111 may be etched, while forming the bit line BL.

More specifically, a pre-bit line structure including a semiconductor film, a metal film and a bit line mask film may be formed on the gate capping pattern 143 and the back gate isolation pattern 111. The pre-bit line structure may be formed on the cell array region CAR. The semiconductor film, the metal film and the bit line mask film may partially cover the cell region element isolation film STI.

Subsequently, a bit line etching stop film 272 may be formed along side walls and bottom surface of the pre-bit line structure. A second upper peri-insulating film 273 may be formed on the bit line etching stop film 272. The second upper peri-insulating film 273 may expose the bit line etching stop film 272 disposed on the upper surface of the pre-bit line structure. After forming the second upper peri-upper insulating film 273, the pre-bit line structure may be patterned to form the bit line BL and the dummy bit line BL_D.

The shielding conductive pattern SL may then be formed on the bit line BL and the dummy bit line BL_D. The shielding conductive pattern SL may be formed between the bit lines BL adjacent to each other in the first direction D1. The shielding insulating liner 171 may define a shielding region between the bit lines BL adjacent to each other in the first direction D1. The shielding conductive pattern SL may be formed in the shielding region of the shielding insulating liner 171.

The shielding conductive pattern SL may be formed between the bit lines BL and on the bit lines BL. The shielding insulating capping film 175 may be formed on the shielding conductive pattern SL.

The third upper peri-insulating film 274 may be formed on the second upper peri-insulating film 273. An upper surface of the third upper peri-insulating film 274 may be coplanar with an upper surface of the shielding insulating capping film 175.

Figure 40:
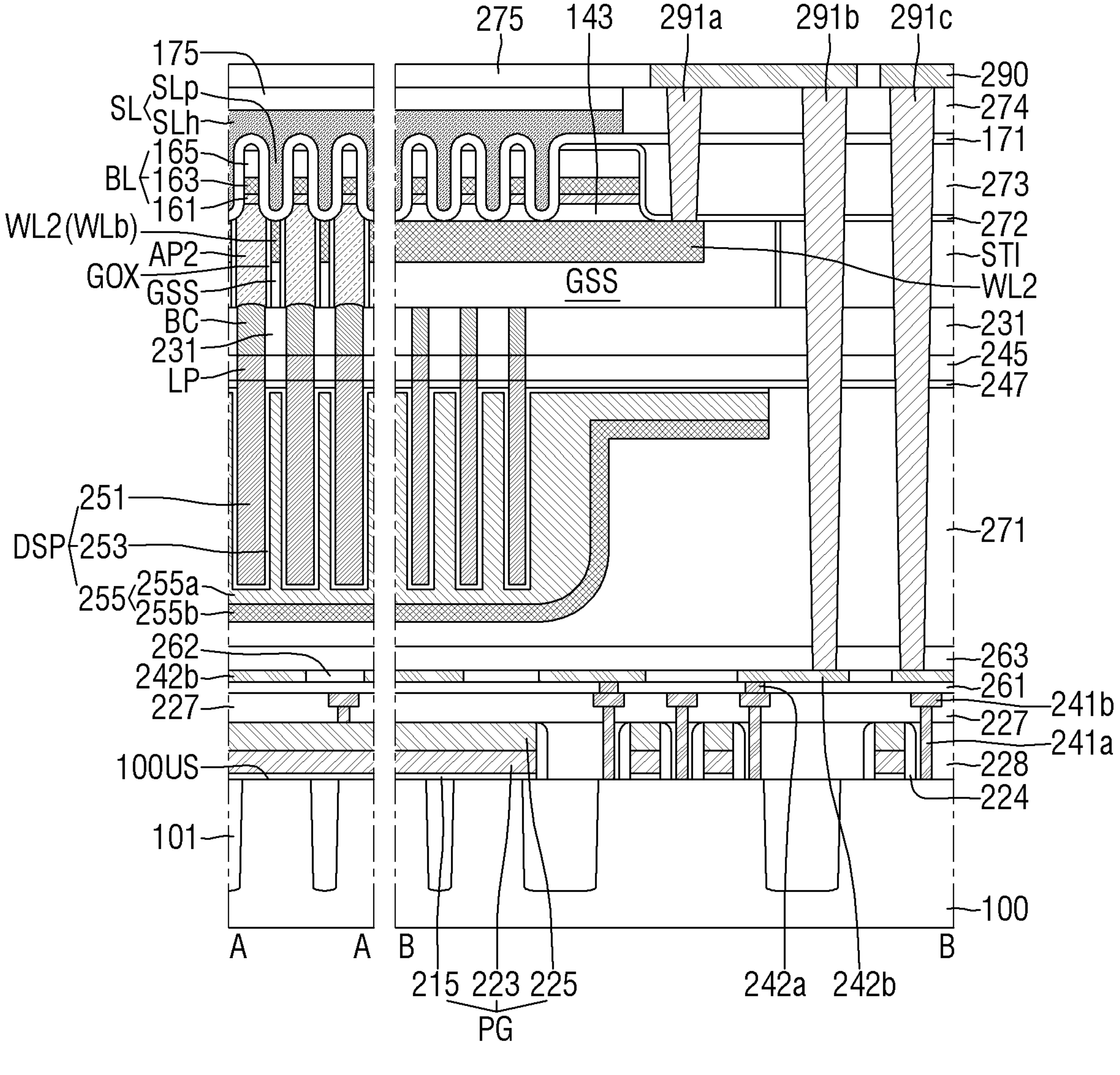
Figure 41:
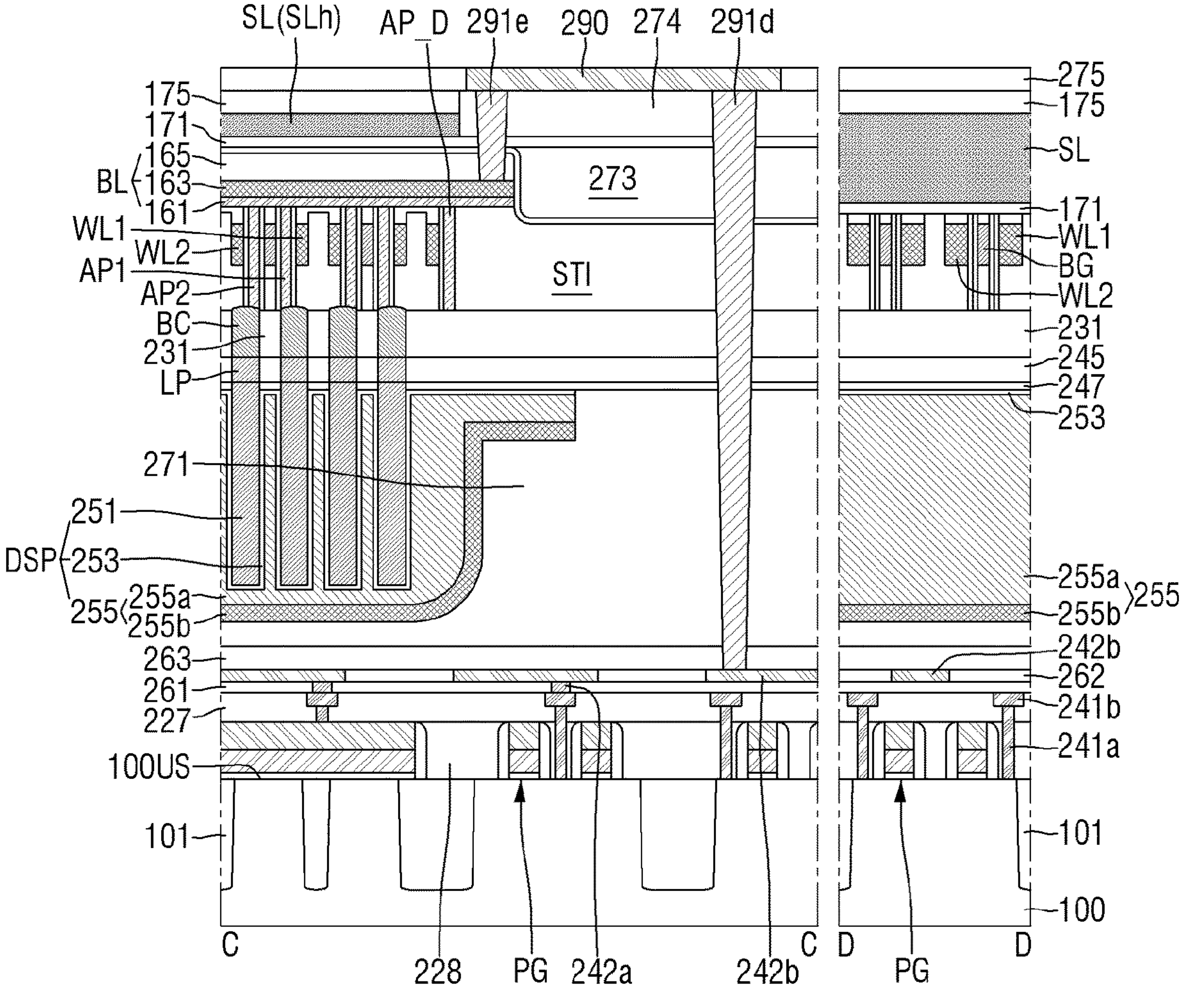

Referring to FIGS. 40 and 41, second peri-connecting vias 291*a*, 291*b*, 291*c*, 291*d* and 291*e* connected to the bit line BL, the first word line WL1, the second word line WL2, the back gate electrode BG, the date storage pattern DSP, the first peri-connecting structures including first peri-connecting via 242*a* and first peri-connecting wiring 242*b*, and the like may be formed.

The second peri-connecting wiring 290 may be formed on the second peri-connecting vias 291*a*, 291*b*, 291*c*, 291*d* and 291*e* and the shielding conductive pattern SL.

Referring to FGS. 3 and 4, the upper connecting pad 295 and the upper connecting plug 296 may be formed on the second peri-connecting structures.

Although the embodiments of the present disclosure have been described with reference to the accompanying drawings, the present disclosure is not limited to the above embodiments and may be implemented in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A semiconductor memory device comprising:
- a peri-gate structure on a substrate;
- a first peri-connecting structure on the peri-gate structure;
- a data storage pattern which is disposed on the first peri-connecting structure;
- an active pattern which is disposed on the data storage pattern and includes a first surface and a second surface opposite to each other in a first direction, and a first side wall and a second side wall opposite to each other in a second direction, the first surface of the active pattern connected to the data storage pattern and facing the substrate;
- a bit line which is disposed on the active pattern, connected to the second surface of the active pattern, and extends in the second direction;
- a word line which is disposed on the first side wall of the active pattern and extends in a third direction;
- a second peri-connecting structure which is disposed on the bit line and connected to the bit line; and
- a connecting pad which is disposed on the second peri-connecting structure and connected to the second peri-connecting structure.

2. The semiconductor memory device of claim 1, further comprising:
- a shielding conductive pattern disposed on the bit line,
- wherein the shielding conductive pattern comprises a shielding conductive plate, and a plurality of shielding conductive protruding parts protruding from the shielding conductive plate.

3. The semiconductor memory device of claim 2,
- wherein the shielding conductive protruding parts protrude toward the substrate.

4. The semiconductor memory device of claim 2,
- wherein each of the plurality of shielding conductive protruding parts extends in the second direction, and
- the bit line is disposed between the shielding conductive protruding parts adjacent to each other in the third direction.

5. The semiconductor memory device of claim 2,
- wherein the shielding conductive pattern comprises side walls extending in the third direction, and
- a part of the bit line protrudes in the second direction beyond the side walls of the shielding conductive pattern.

6. The semiconductor memory device of claim 1, wherein the second peri-connecting structure comprises a second peri-connecting wiring and a second peri-connecting via and the second peri-connecting via connects the first peri-connecting structure and the second peri-connecting wiring.

7. The semiconductor memory device of claim 6,
wherein the second peri-connecting via comprises a second lower peri-connecting via and a second upper peri-connecting via, and
the second upper peri-connecting via is disposed between the second lower peri-connecting via and the second peri-connecting wiring.

8. The semiconductor memory device of claim 7,
wherein an upper surface of the second lower peri-connecting via is lower than an uppermost part of the bit line, relative to an upper side of the substrate.

9. The semiconductor memory device of claim 1, further comprising:
a bonding insulating film disposed between the data storage pattern and the first peri-connecting structure.

10. The semiconductor memory device of claim 1, further comprising:
a shielding conductive pattern disposed on the bit line; and
a dummy bit line which is disposed between the shielding conductive pattern and the word line and extends in the second direction,
wherein the substrate includes a cell array region and a peripheral circuit region,
the dummy bit line is disposed along a boundary between the cell array region and the peripheral circuit region,
the dummy bit line includes side walls extending in the second direction, and
a part of the word line protrudes in the third direction beyond the side wall of the dummy bit line.

11. The semiconductor memory device of claim 1, further comprising:
a back gate electrode which is disposed on the second side wall of the active pattern and extends in the third direction.

12. The semiconductor memory device of claim 1,
wherein the word line comprises a first portion and a second portion disposed alternately in the third direction,
a width of the first portion of the word line in the second direction is smaller than a width of the second portion of the word line in the second direction, and
the active pattern is disposed between the second portion of the word line adjacent to each other in the third direction.

13. A semiconductor memory device comprising:
a peri-gate structure on a substrate;
a first peri-connecting structure on the peri-gate structure;
a data storage pattern on the first peri-connecting structure;
a first active pattern and a second active pattern which are disposed on the data storage pattern and spaced apart from each other in a first direction;
a first word line which is disposed between the first active pattern and the second active pattern on the data storage pattern, and extends in a second direction;
a second word line which is disposed between the first active pattern and the second active pattern on the data storage pattern, extends in the second direction, and is spaced apart from the first word line in the first direction;
a bit line which is disposed on the first active pattern and the second active pattern and extends in the first direction;
a gate isolation pattern which is disposed between the first word line and the second word line, and includes a horizontal part and a protruding part, the protruding part of the gate isolation pattern protruding from the horizontal part of the gate isolation pattern toward the bit line, a width of the horizontal part of the gate isolation pattern being greater than a width of the protruding part of the gate isolation pattern in the first direction;
a shielding conductive pattern which is disposed on the bit line; and
a connecting pad which is disposed on the shielding conductive pattern and connected to the first peri-connecting structure.

14. The semiconductor memory device of claim 13,
wherein the shielding conductive pattern comprises a shielding conductive plate and a plurality of shielding conductive protruding parts protruding from the shielding conductive plate toward the substrate, and
the plurality of shielding conductive protruding parts each extend in the first direction.

15. The semiconductor memory device of claim 14,
wherein the shielding conductive plate is disposed on the bit line, and
the bit line is disposed between the shielding conductive protruding parts adjacent to each other in the second direction.

16. The semiconductor memory device of claim 13, further comprising:
a second peri-connecting structure which connects the first peri-connecting structure and the connecting pad,
wherein the second peri-connecting structure comprises a second peri-connecting wiring disposed on the shielding conductive pattern, and a second peri-connecting via which connects the second peri-connecting wiring and the first peri-connecting structure.

17. The semiconductor memory device of claim 16,
wherein the second peri-connecting via comprises a second lower peri-connecting via and a second upper peri-connecting via, and
the second upper peri-connecting via is disposed between the second lower peri-connecting via and the second peri-connecting wiring.

18. The semiconductor memory device of claim 13, further comprising:
a bonding insulating film disposed between the data storage pattern and the first peri-connecting structure,
wherein the bonding insulating film comprises silicon carbonitride (SiCN).

19. A semiconductor memory device comprising:
a peri-gate structure on a substrate;
a first peri-connecting structure on the peri-gate structure;
a data storage pattern on the first peri-connecting structure;
first and second active patterns which are disposed on the data storage pattern and disposed alternately along a first direction;
back gate electrodes which are disposed on the data storage pattern, and extend in a second direction between the first and second active patterns adjacent to each other;
first word lines which are each disposed adjacent to the first active patterns and extend in the second direction;
second word lines which are disposed adjacent to the second active patterns and extend in the second direction;
a shielding conductive pattern which is disposed on the first active pattern and the second active pattern, and includes a shielding conductive plate and a plurality of shielding conductive protruding parts, the plurality of shielding conductive protruding parts each protruding from the shielding conductive plate toward the data storage pattern and extending in the first direction;

bit lines which are disposed between the shielding conductive protruding parts adjacent to each other in the second direction on the first active pattern and the second active pattern, and extend in the first direction;

a second peri-connecting structure which includes a second peri-connecting wiring disposed on the shielding conductive pattern, and a second peri-connecting via which connects the second peri-connecting wiring and the first peri-connecting structure; and a connecting pad which is disposed on the second peri-connecting wiring and connected to the second peri-connecting wiring.

20. The semiconductor memory device of claim 19, further comprising:

a bonding insulating film which is disposed between the data storage pattern and the first peri-connecting structure, wherein the bonding insulating film comprises silicon carbonitride (SiCN).

* * * * *